United States Patent
Taylor et al.

(10) Patent No.: US 7,537,994 B2
(45) Date of Patent: May 26, 2009

(54) METHODS OF FORMING SEMICONDUCTOR DEVICES, ASSEMBLIES AND CONSTRUCTIONS

(75) Inventors: Ted Taylor, Boise, ID (US); Xiawan Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 11/511,596

(22) Filed: Aug. 28, 2006

(65) Prior Publication Data

US 2008/0048298 A1 Feb. 28, 2008

(51) Int. Cl.
H01L 21/8238 (2006.01)
H01L 21/336 (2006.01)
H01L 21/8236 (2006.01)
H01L 21/3205 (2006.01)

(52) U.S. Cl. .................. 438/259; 438/206; 438/209; 438/211; 438/257; 438/270; 438/271; 438/277; 438/585; 438/587; 438/589

(58) Field of Classification Search .................. None
See application file for complete search history.

(56) References Cited

U.S. PATENT DOCUMENTS

| | | | |
|---|---|---|---|
| 4,845,048 A | 7/1989 | Tamaki | |
| 5,681,773 A | 10/1997 | Tseng | |
| 5,801,083 A | 9/1998 | Yu et al. | |
| 5,963,789 A | 10/1999 | Tsuchiaki | |
| 5,972,758 A | 10/1999 | Liang | |
| 6,232,202 B1 | 5/2001 | Hong | |
| 6,285,057 B1 | 9/2001 | Hopper et al. | |
| 6,521,538 B2 | 2/2003 | Soga et al. | |
| 6,716,757 B2 | 4/2004 | Lin et al. | |
| 7,005,347 B1 * | 2/2006 | Bhalla et al. ............... | 438/259 |
| 7,220,640 B2 * | 5/2007 | Kim ............... | 438/243 |
| 2002/0031898 A1 | 3/2002 | Gonzalez et al. | |
| 2002/0135549 A1 * | 9/2002 | Kawata ............... | 345/87 |
| 2003/0190766 A1 | 10/2003 | Gonzalez et al. | |
| 2004/0110358 A1 | 6/2004 | Lee | |
| 2004/0113230 A1 * | 6/2004 | Divakaruni et al. ......... | 257/510 |
| 2005/0029619 A1 | 2/2005 | Forbes | |
| 2005/0199932 A1 | 9/2005 | Abbott et al. | |
| 2007/0148934 A1 * | 6/2007 | Cho et al. ............... | 438/585 |

FOREIGN PATENT DOCUMENTS

DE 101 57 785 A1 6/2003

(Continued)

OTHER PUBLICATIONS

US/2007/016947, Jul. 27, 2007, PCT Search Report.

(Continued)

*Primary Examiner*—Matthew Smith
*Assistant Examiner*—James M Mitchell
(74) *Attorney, Agent, or Firm*—Wells St. John P.S.

(57) ABSTRACT

Embodiments disclosed herein include methods in which a pair of openings are formed into semiconductor material, with the openings being spaced from one another by a segment of the semiconductor material. Liners are formed along sidewalls of the openings, and then semiconductor material is isotropically etched from bottoms of the openings to merge the openings and thereby completely undercut the segment of semiconductor material. Embodiments disclosed herein may be utilized in forming SOI constructions, and in forming field effect transistors having transistor gates entirely surrounding channel regions. Embodiments disclosed herein also include semiconductor constructions having transistor gates surrounding channel regions, as well as constructions in which insulative material entirely separates an upper semiconductor material from a lower semiconductor material.

5 Claims, 25 Drawing Sheets

FOREIGN PATENT DOCUMENTS

| | | | |
|---|---|---|---|
| EP | 0 059 264 | A1 | 12/1981 |
| EP | 1 229 579 | A2 | 8/2002 |
| WO | WO 2005/117073 | A1 | 12/2005 |
| WO | WO2006/109265 | * | 10/2006 |
| WO | WO2006/117734 | * | 11/2006 |

OTHER PUBLICATIONS

Yeo, H.K., et al. "80 nm 512M DRAM with Enhanced Data Retention Time Using Partially-Insulated Cell Array Transistor (PiCAT)" Sep. 2004, 2004 Symposium on VLSI Technology Digest of Technical Papers, pp. 30-31.

US/2007/016947, Jul. 27, 2007, PCT Written Opinion.

U.S. Appl. No. 11/436,726, filed May 17, 2006, Fischer.

U.S. Appl. No. 11/168,861, filed Jun. 28, 2005, Wang et al.

US2006/020877, May 24, 2006, PCT Search Report.

Kim, J.Y., et al. "S-RCAT (Sphere-shaped-Recess-Channel-Array Transistor) Technology for 70nm DRAM feature size and beyond" 2005 Symposium on VLSI Technology Digest of Technical Papers.

* cited by examiner

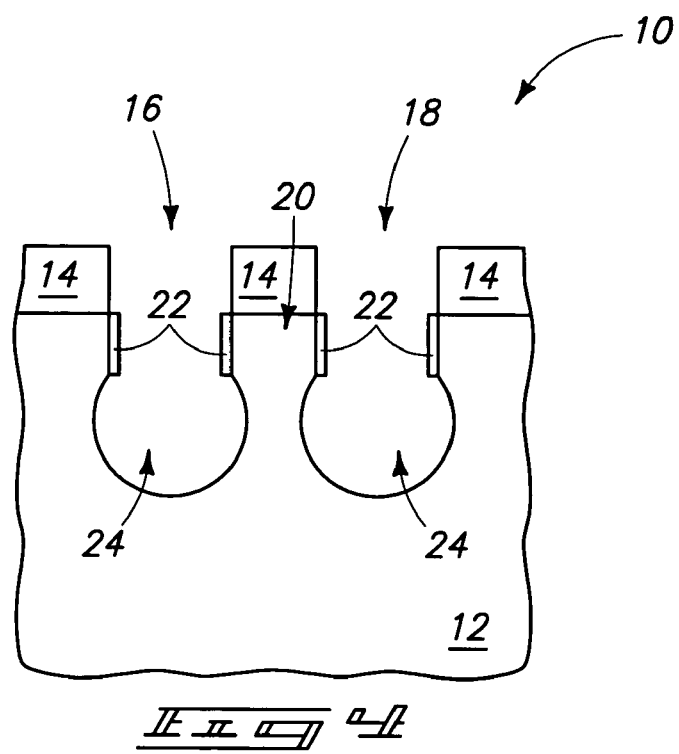
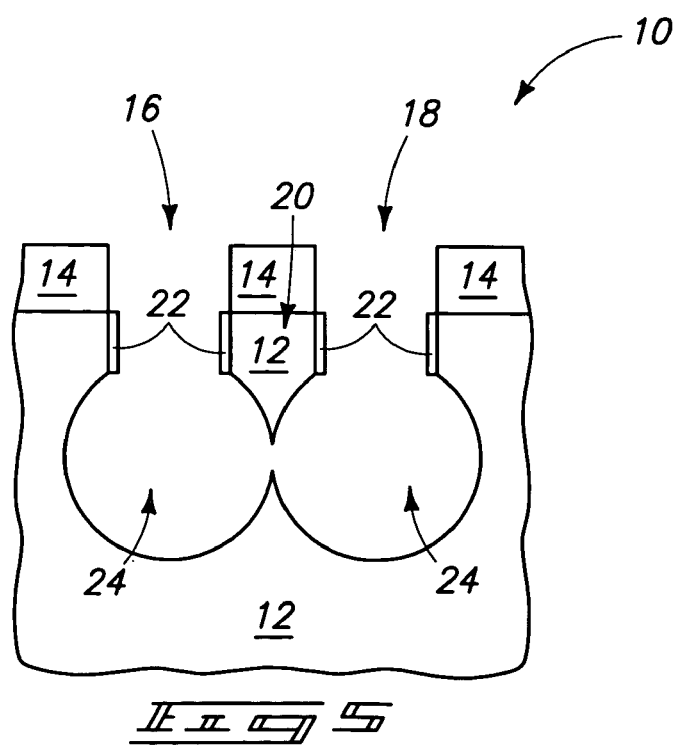

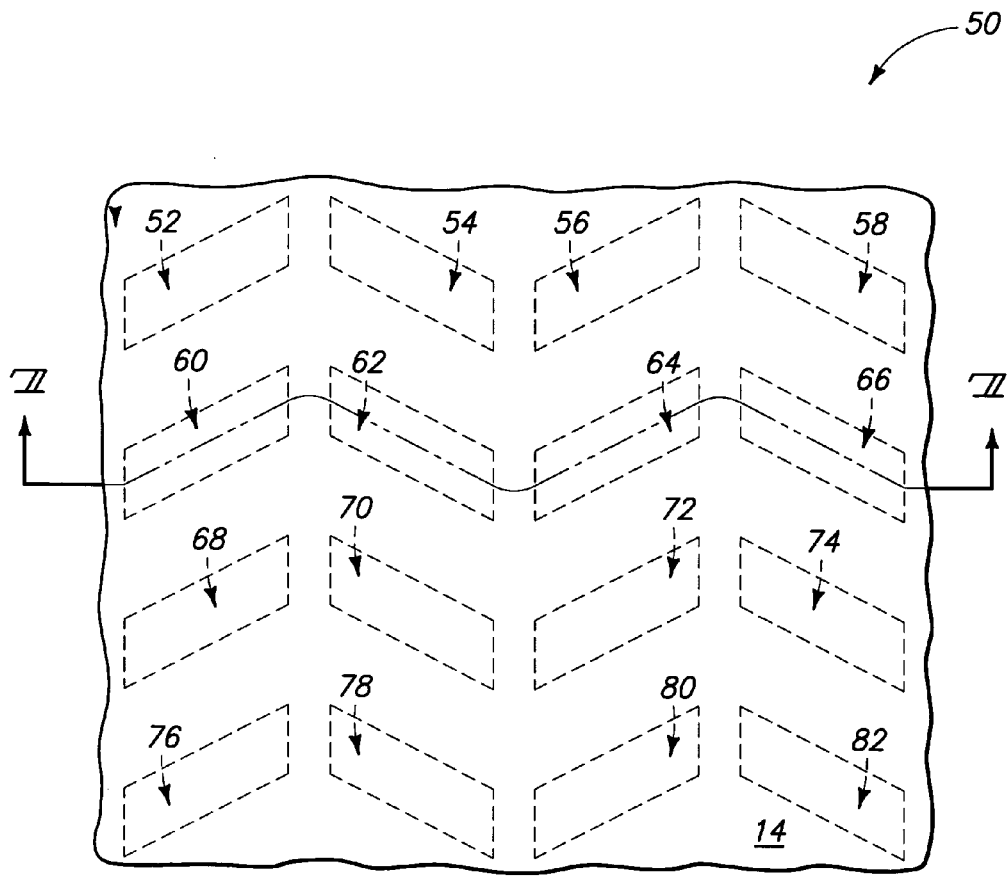
_FIG. 6_
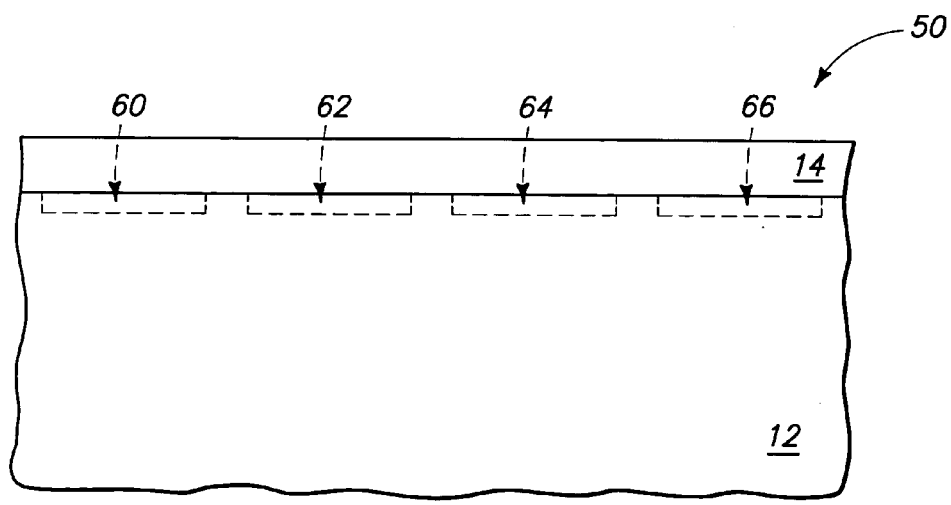
_FIG. 7_

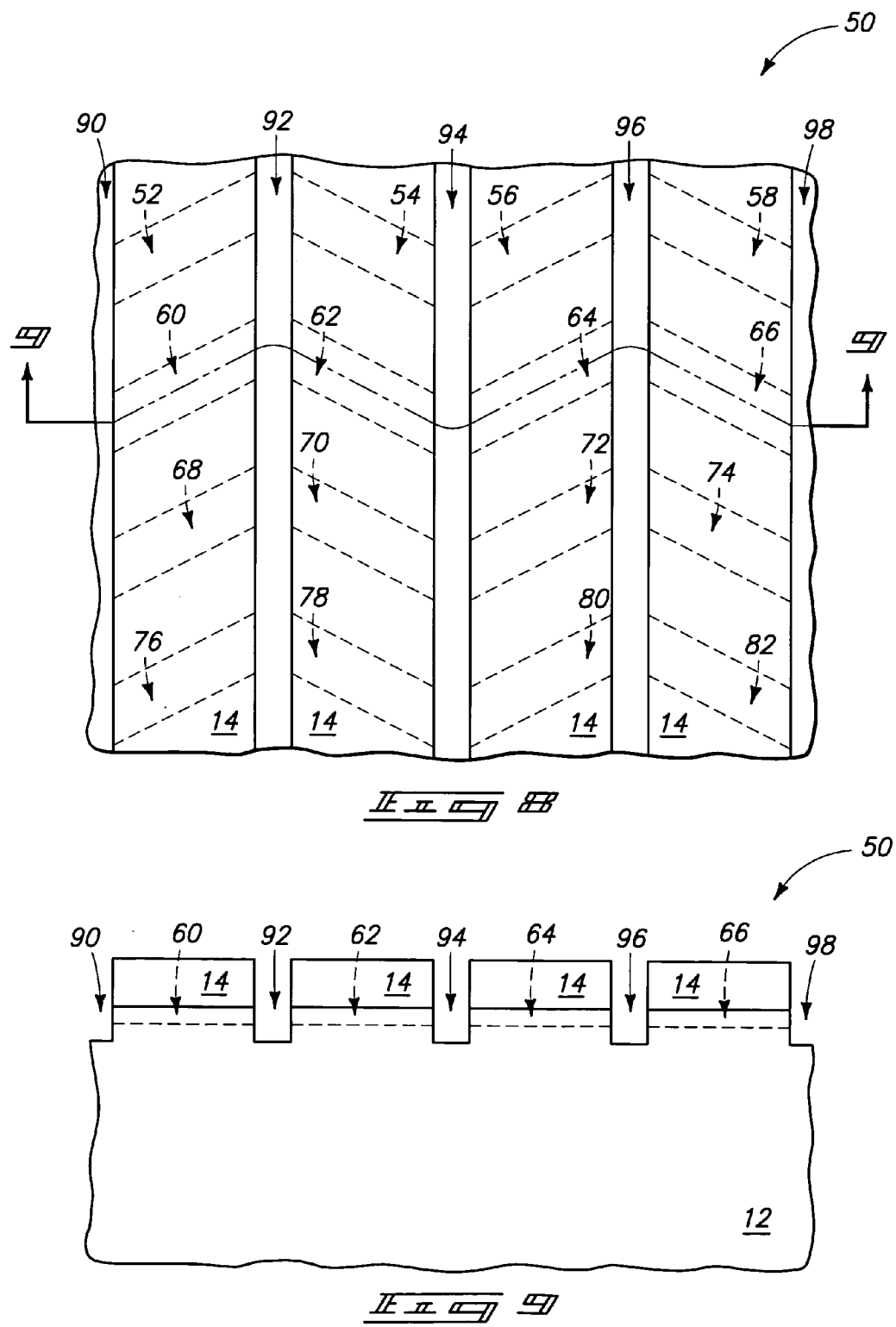

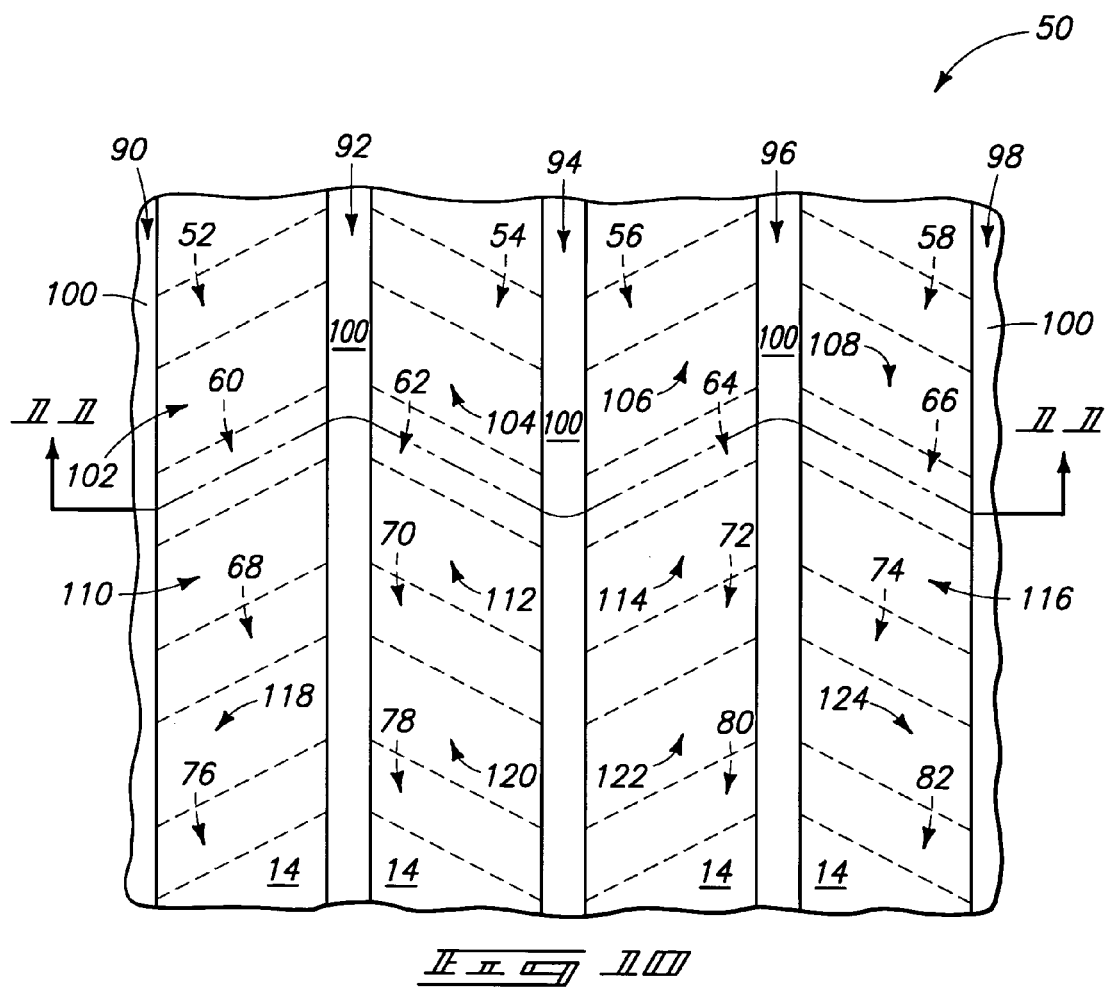
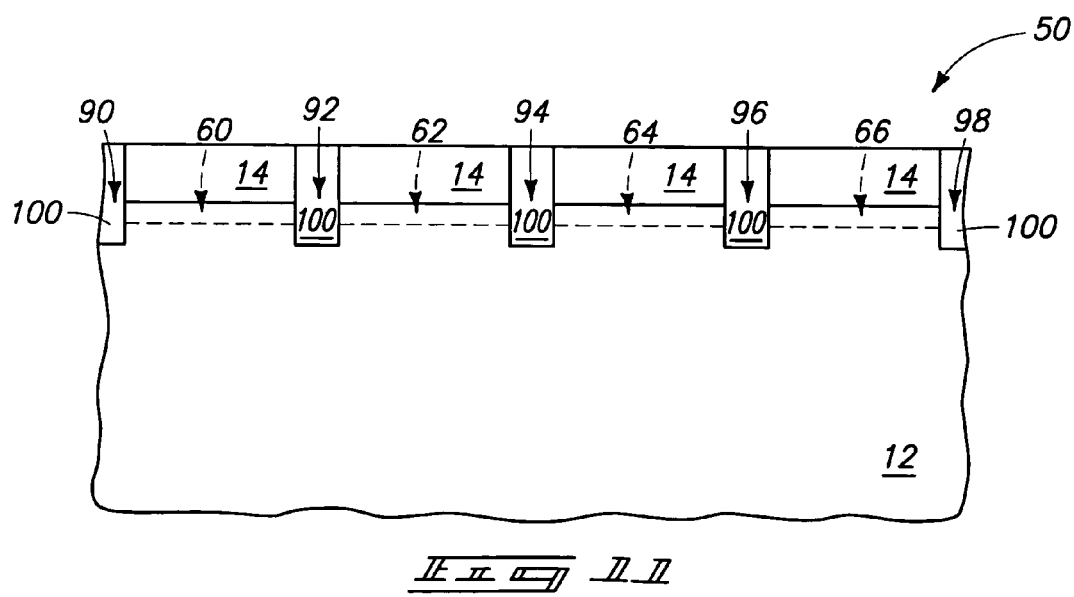

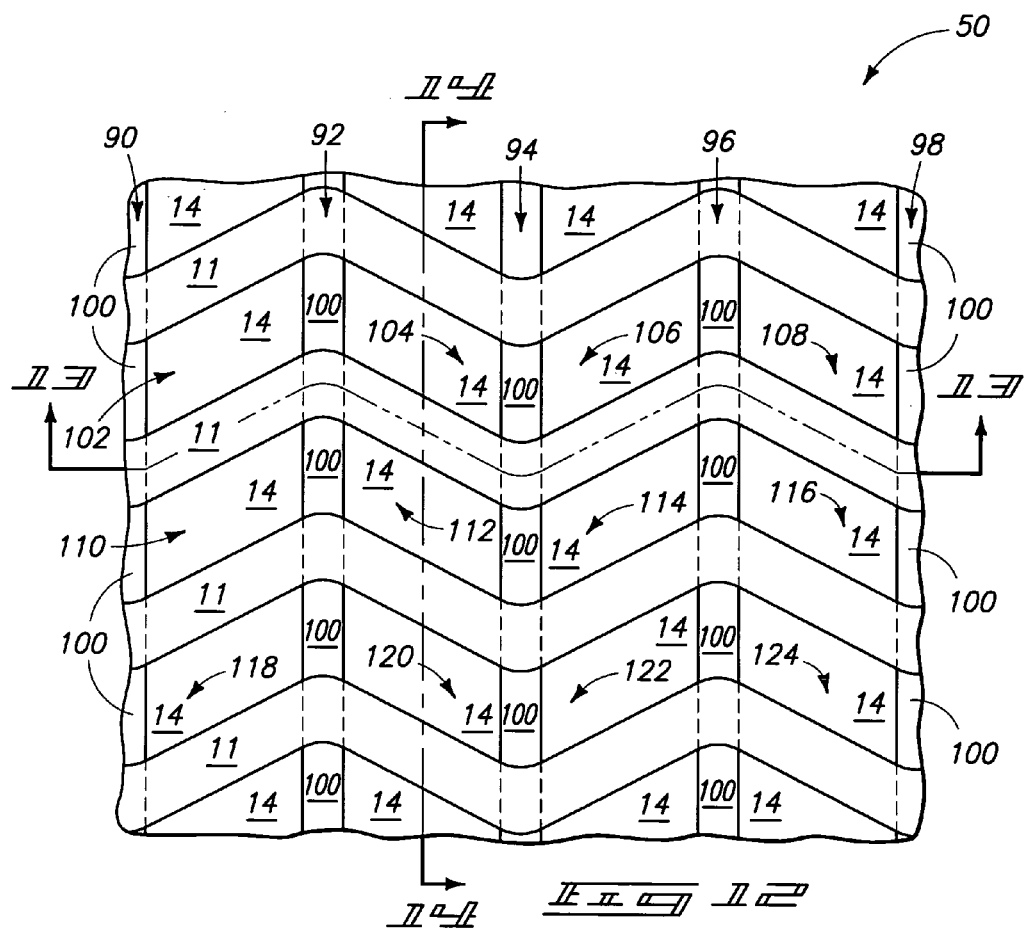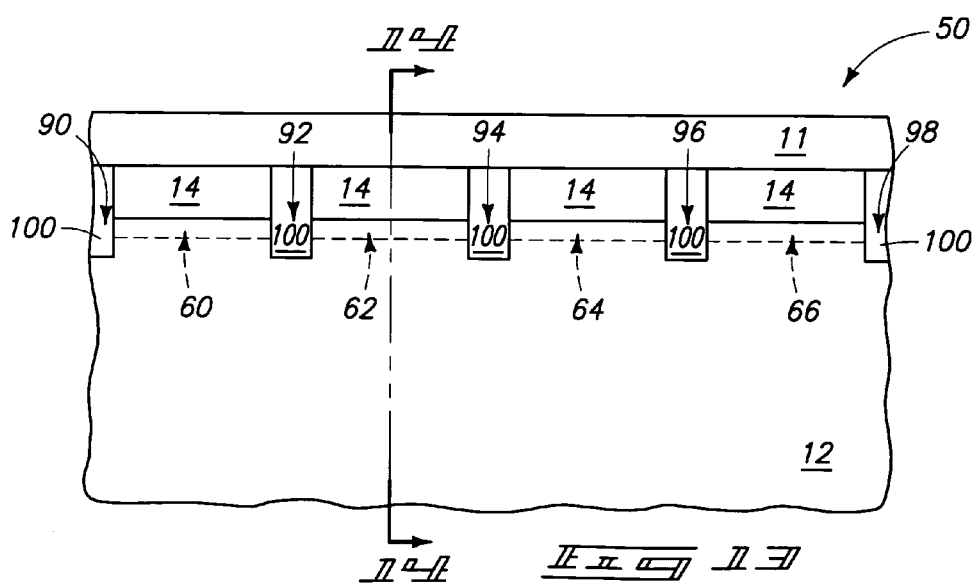

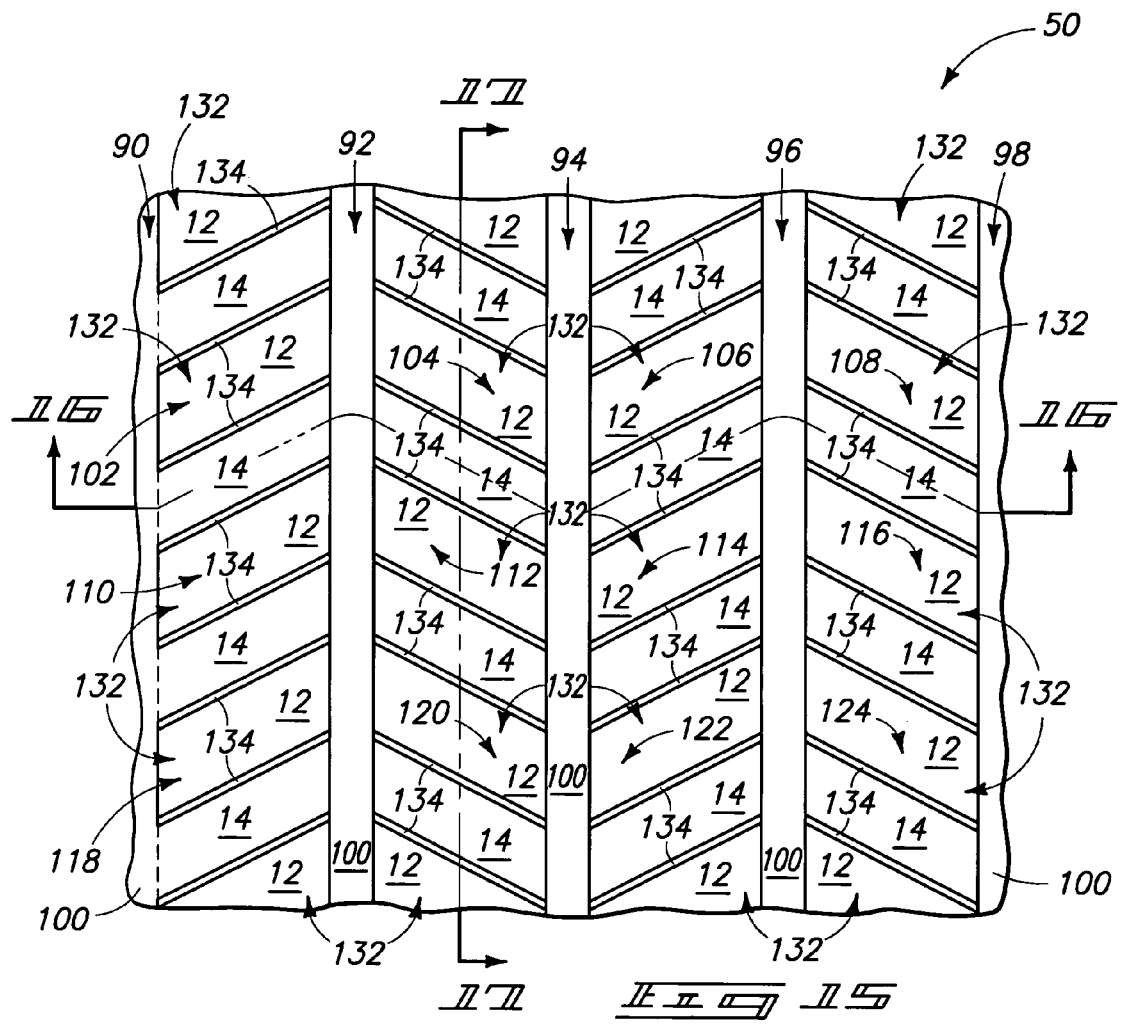
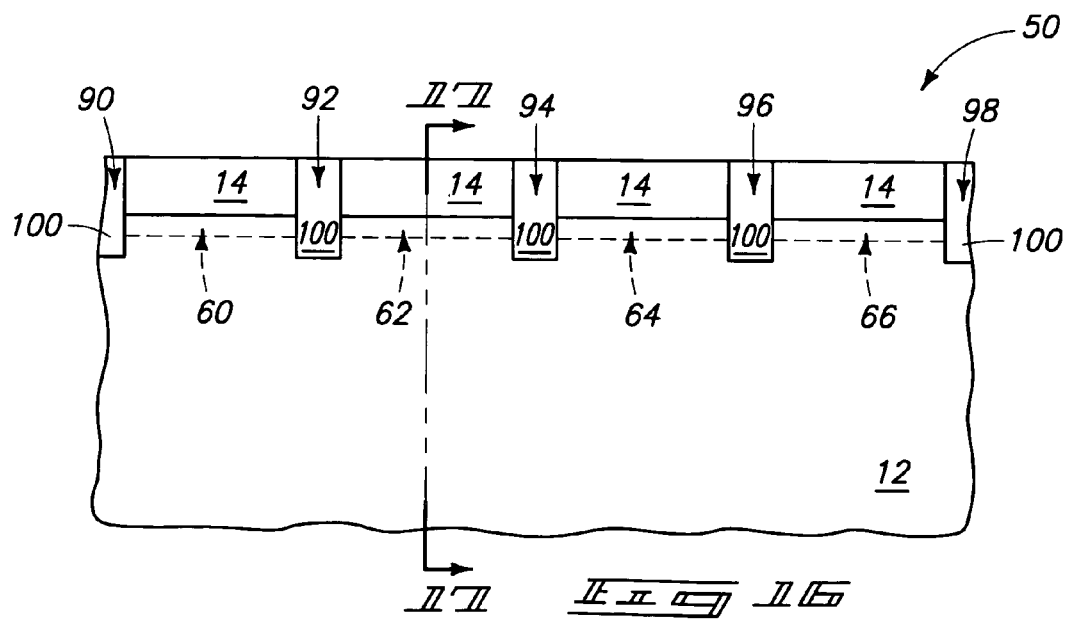

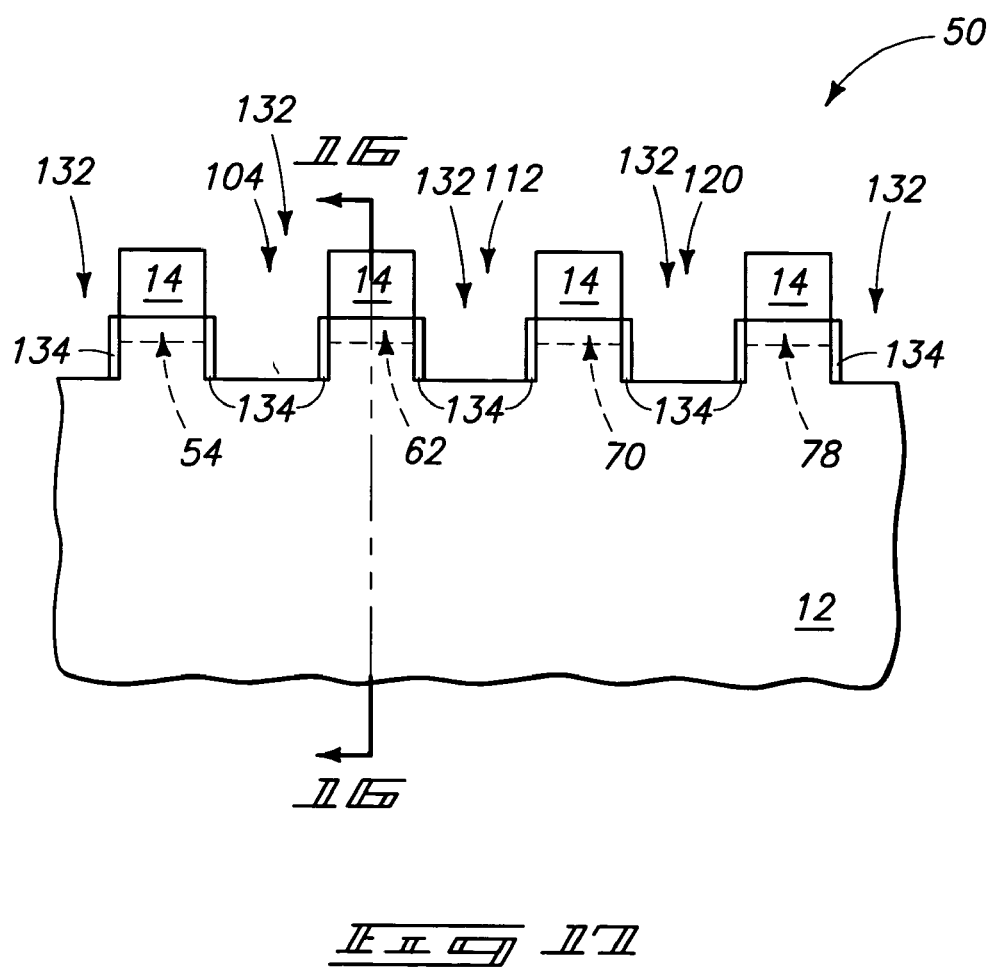

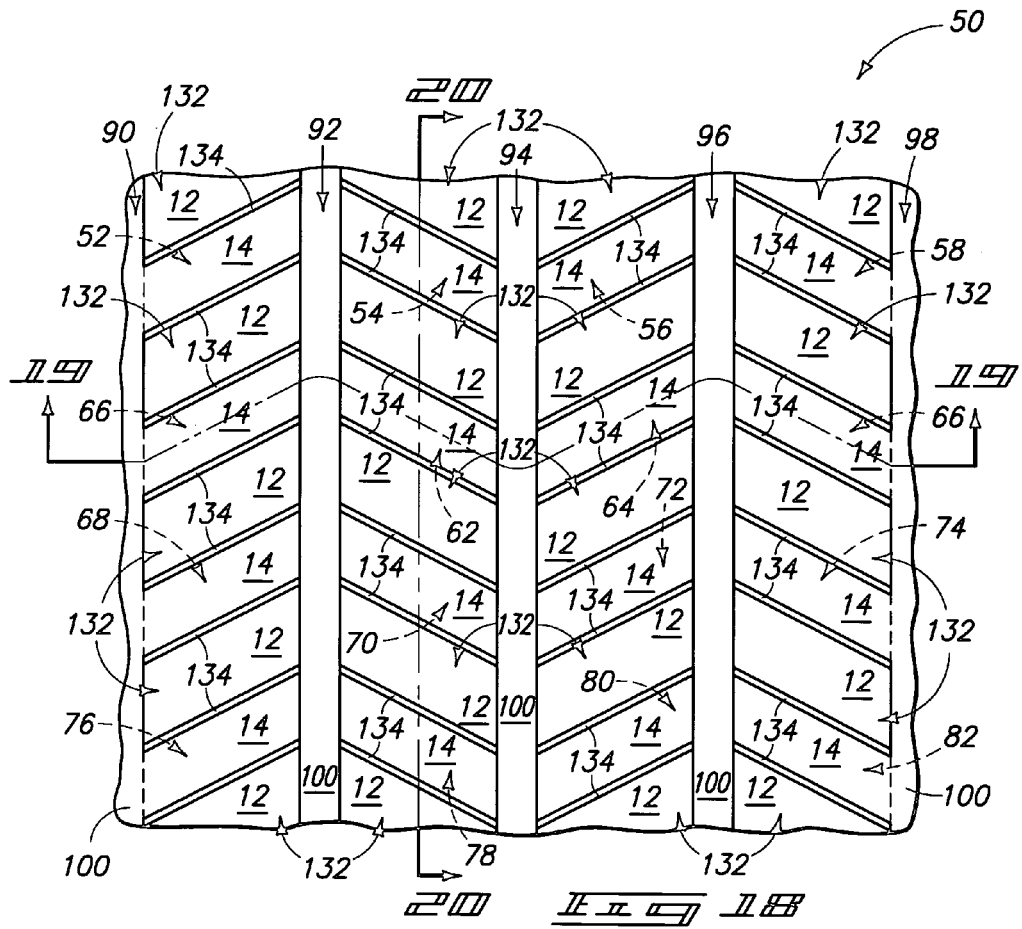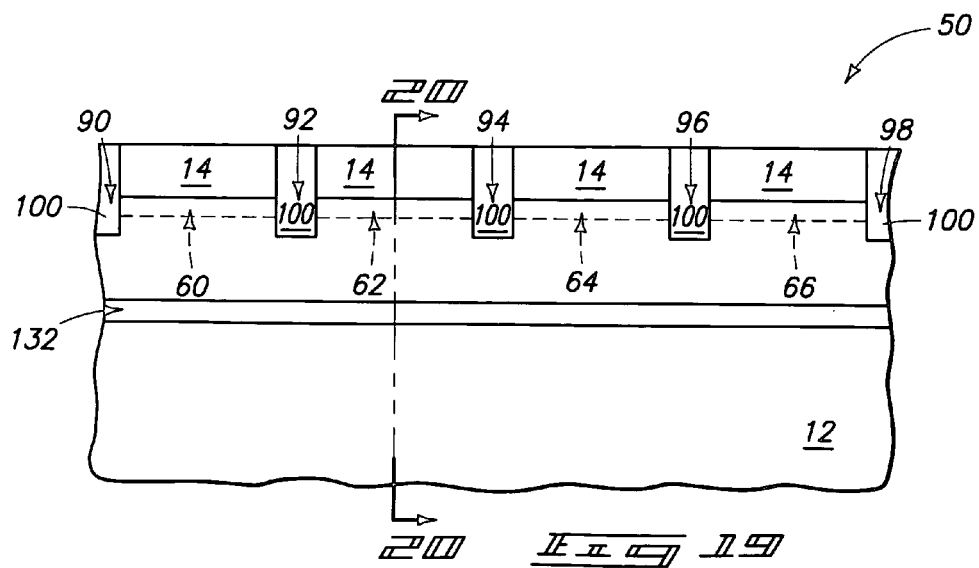

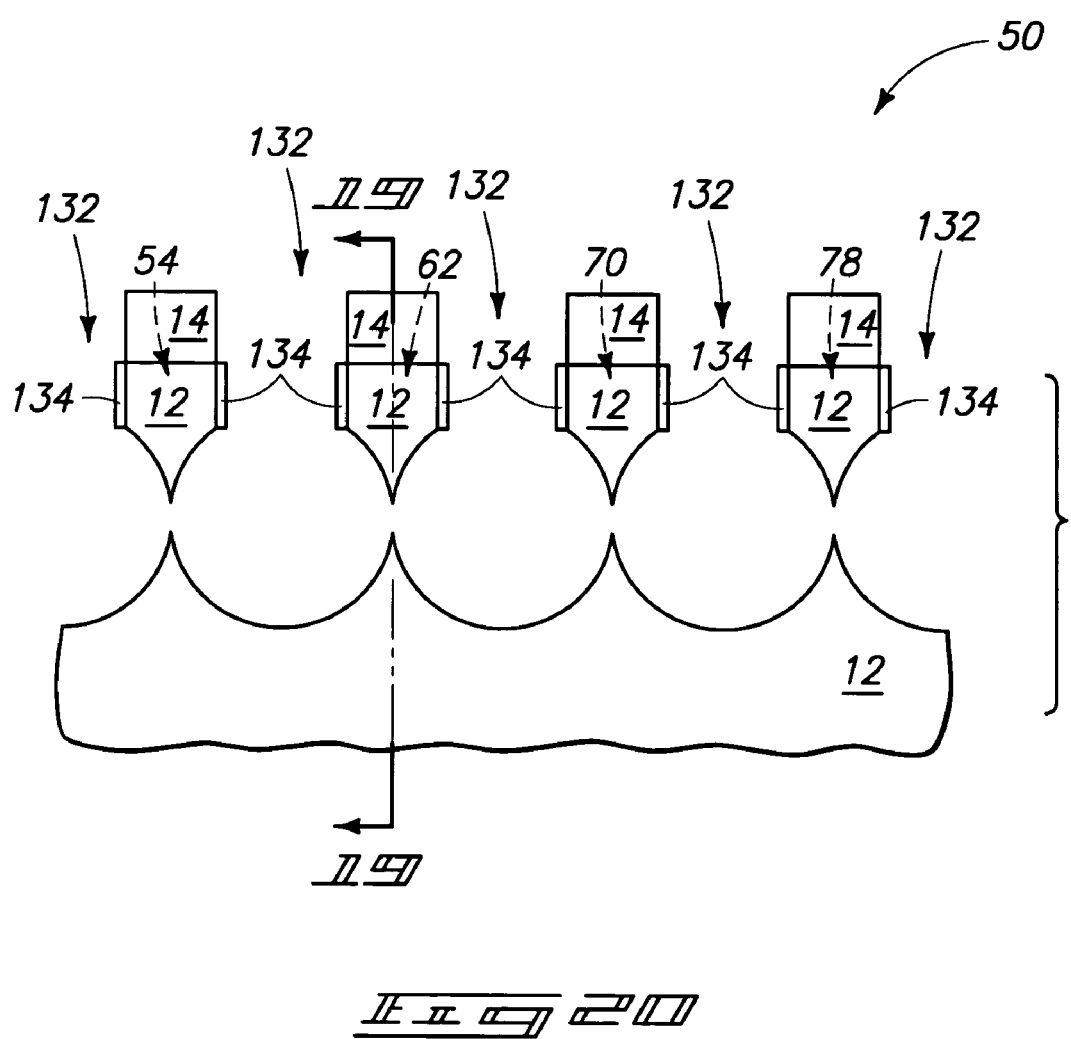

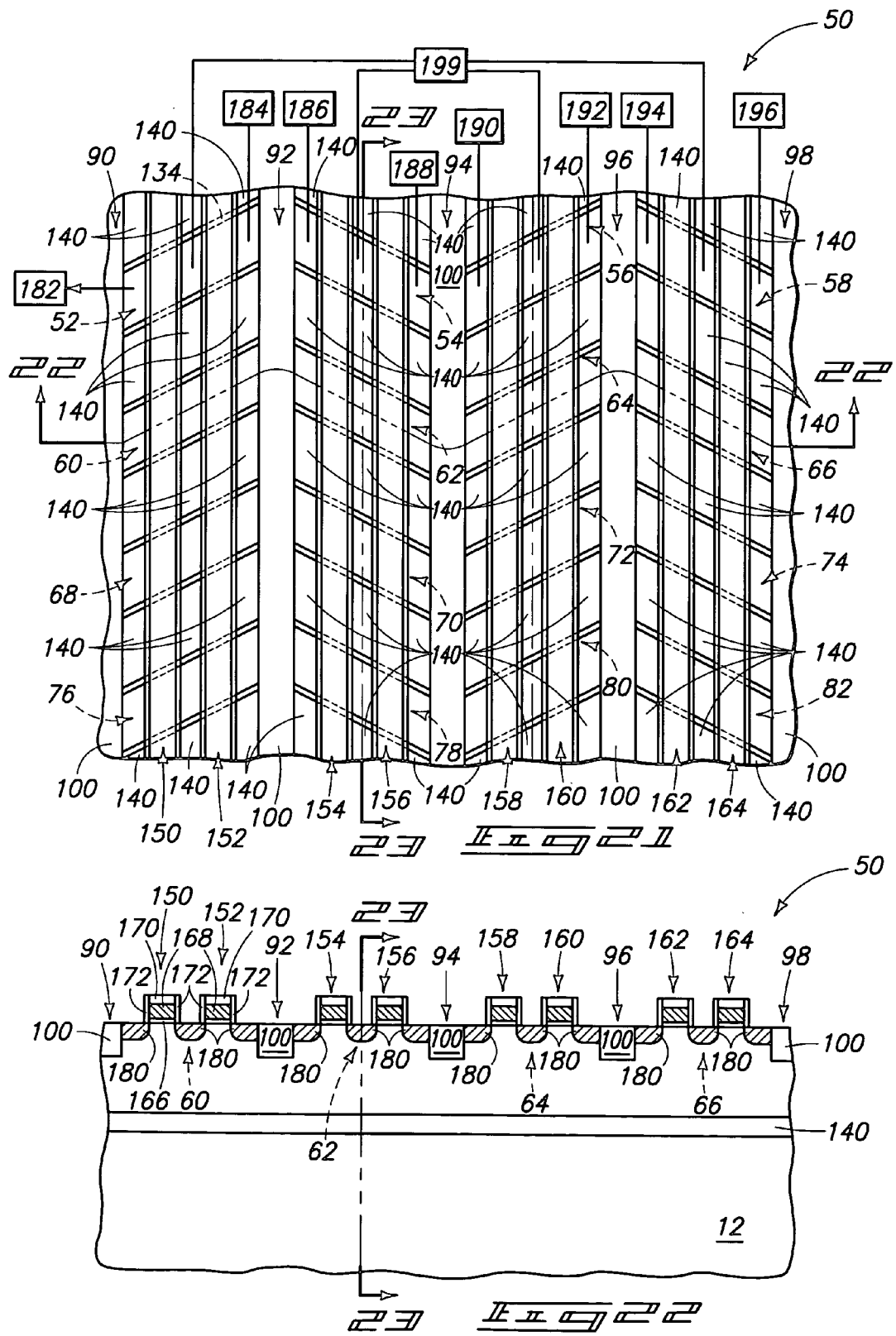

METHODS OF FORMING SEMICONDUCTOR DEVICES, ASSEMBLIES AND CONSTRUCTIONS

TECHNICAL FIELD

The technical field is semiconductor devices, assemblies and constructions, and methods of forming semiconductor devices, assemblies and constructions.

BACKGROUND

A continuing goal of semiconductor device fabrication is to conserve semiconductor wafer real estate (in other words, to achieve high integration) while maintaining integrity and desired performance characteristics of semiconductor devices. Such has led to development and improvement of various semiconductor constructions, including, for example, silicon-on-insulator (SOI) constructions, and fin field effect transistors (finFETs).

BRIEF DESCRIPTION OF THE DRAWINGS

FIG. 4 is a view of the FIG. 1 fragment shown at a processing stage subsequent to that of FIG. 3.

FIG. 5 is a view of the FIG. 1 fragment shown at a processing stage subsequent to that of FIG. 4.

FIGS. 6 and 7 are a top view and cross-sectional side view, respectively, of a fragment of a semiconductor construction shown at a preliminary processing stage in accordance with another embodiment. The cross-section of FIG. 7 is along the line 7-7 of FIG. 6.

FIGS. 8 and 9 are views of the fragments of FIGS. 6 and 7, respectively, shown at a processing stage subsequent to that of FIGS. 6 and 7. The cross-section of FIG. 9 is along the line 9-9 of FIG. 8.

FIGS. 10 and 11 are views of the fragments of FIGS. 6 and 7, respectively, shown at a processing stage subsequent to that of FIGS. 8 and 9. The cross-section of FIG. 11 is along the line 11-11 of FIG. 10.

FIGS. 12-14 are views of the semiconductor construction of FIGS. 6 and 7 shown at a processing stage subsequent to that of FIGS. 10 and 11. FIGS. 12 and 13 correspond to the views of FIGS. 6 and 7, respectively, and FIG. 14 corresponds to a view approximately orthogonal to that of FIG. 13. The cross-section of FIG. 13 is along the lines 13-13 of FIGS. 12 and 14; and the cross-section of FIG. 14 is along the lines 14-14 of FIGS. 12 and 13.

FIGS. 15-17 are views of the semiconductor construction of FIGS. 6 and 7 shown at a processing stage subsequent to that of FIGS. 12-14; with the fragments of FIGS. 15-17 corresponding to the fragments of FIGS. 12-14, respectively. The cross-section of FIG. 16 is along the lines 16-16 of FIGS. 15 and 17; and the cross-section of FIG. 17 is along the lines 17-17 of FIGS. 15 and 16.

FIGS. 18-20 are views of the semiconductor construction of FIGS. 6 and 7 shown at a processing stage subsequent to that of FIGS. 15-17; with the fragments of FIGS. 18-20 corresponding to the fragments of FIGS. 12-14, respectively. The cross-section of FIG. 19 is along the lines 19-19 of FIGS. 18 and 20; and the cross-section of FIG. 20 is along the lines 20-20 of FIGS. 18 and 19.

FIGS. 21-23 are views of the semiconductor construction of FIGS. 6 and 7 shown at a processing stage subsequent to that of FIGS. 18-20; with the fragments of FIGS. 21-23 corresponding to the fragments of FIGS. 12-14, respectively. The cross-section of FIG. 22 is along the lines 22-22 of FIGS. 21 and 23; and the cross-section of FIG. 23 is along the lines 23-23 of FIGS. 21 and 22.

DETAILED DESCRIPTION OF THE PREFERRED EMBODIMENTS

This disclosure is submitted in furtherance of the constitutional purposes of the U.S. Patent Laws "to promote the progress of science and useful arts" (Article 1, Section 8).

In some embodiments, a pair of openings are formed in a semiconductor material, with such openings being spaced from one another by a segment of the semiconductor material. Liners are then formed along sidewalls the openings, and the semiconductor material is isotropically etched from bottoms of the lined openings to merge the openings and thereby completely undercut the segment of semiconductor material. Such embodiments may be utilized for forming three-dimensional structures in silicon, and may be applied toward fabrication of SOI structures and fully surrounded transistor structures (in other words, transistors having gates encircling a channel region).

A first embodiment is described with reference to FIGS. 1-5.

Figure 1:
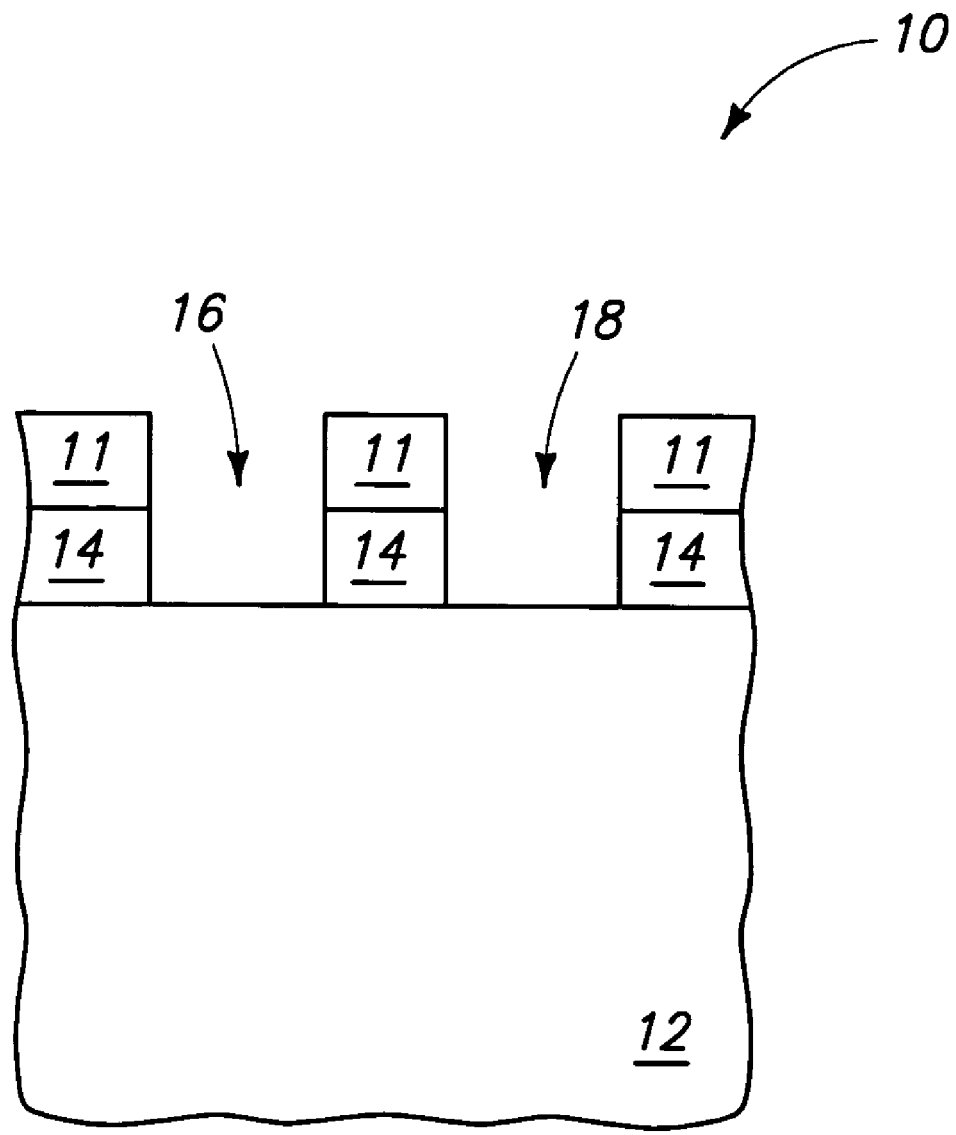
FIG. 1 is a diagrammatic, cross-sectional, fragmentary view of a semiconductor construction at a preliminary processing stage of an embodiment.

Referring initially to FIG. 1, a semiconductor construction 10 is illustrated at a preliminary processing stage. Construction 10 comprises a base 12 containing semiconductor material. In some embodiments, base 12 may be a silicon wafer, and may comprise, consist essentially of, or consist of monocrystalline silicon lightly-doped with background p-type dopant. The base 12 may be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of masking materials 11 and 14 are over substrate 12, and patterned to have a pair of openings 16 and 18 extending therethrough. Material 11 may, for example, consist of photolithographically patterned photoresist; and material 14 may comprise one or both of silicon nitride and silicon dioxide. The pattern in material 14 can be formed by transferring a pattern from photolithographically patterned resist 11 into an underlying layer of material 14 with one or more etches.

Figure 2:
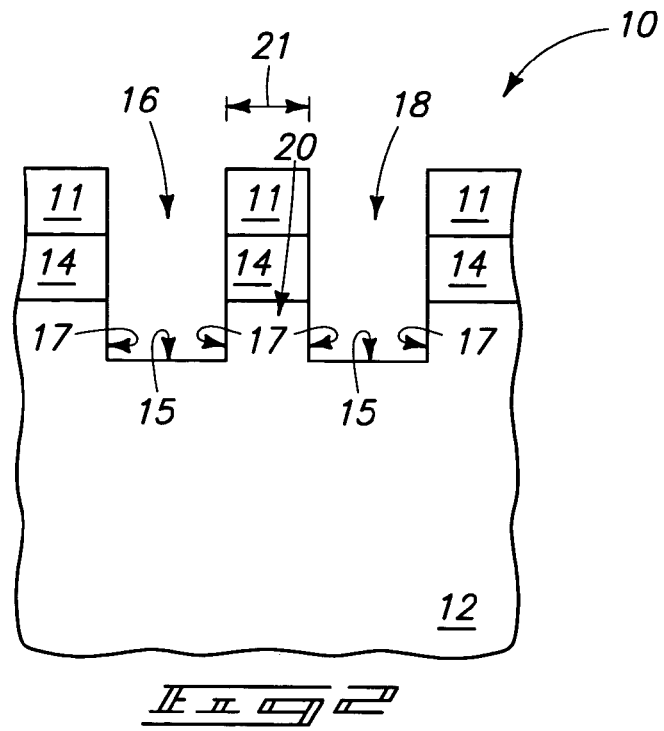
FIG. 2 is a view of the FIG. 1 fragment shown at a processing stage subsequent to that of FIG. 1.

Referring to FIG. 2, openings 16 and 18 are extended into base 12 with an appropriate etch. Such etch is shown to be an anisotropic etch (such as, for example, an etch using $Cl_2$ and HBr), and specifically to be directed primarily downwardly into base 12. The openings within base 12 have a periphery comprising bottoms 15 and sidewalls 17. It is noted that the openings would have backside surfaces behind the plane of FIG. 2 that would be visible in the view of FIG. 2. However, in order to simplify the drawings, only surfaces along the plane of a cross-section will be shown in the cross-sectional views presented herein.

The openings 16 and 18 within base 12 may be considered to be a pair of openings which are spaced from one another by a segment 20 of the semiconductor material of base 12. The segment 20 comprises a width 21 between the openings 16 and 18. Such width may be, for example, from about 10 nanometers to about 350 nanometers.

Figure 3:
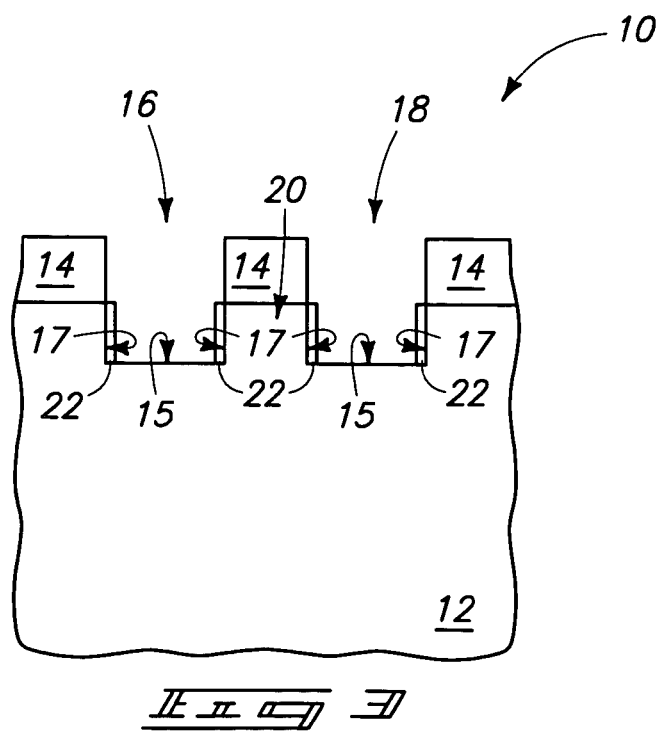
FIG. 3 is a view of the FIG. 1 fragment shown at a processing stage subsequent to that of FIG. 2.

Referring to FIG. 3, photoresist 11 (FIG. 2) is removed, and liners 22 are formed along exposed sidewalls 17 of the openings 16 and 18 within base 12. The photoresist can be removed in a reaction chamber utilizing an $O_2$ plasma. The liners can be formed in the same chamber as is used for removing of the photoresist, and utilizing the $O_2$ plasma; but the substrate may be biased differently for formation of the liners than for removal of the photoresist. If base 12 corresponds to a monocrystalline silicon wafer, liners 22 may comprise, consist essentially of, or consist of silicon dioxide. Such silicon dioxide would extend across bottoms of the openings, as well as along the sidewalls, but may be subsequently removed from the bottoms with an appropriate etch to leave the liners only along the sidewalls. Liners 22 may be referred to as protective material, in that the liners protect sidewalls 17 from a subsequent etch. Liners 22 narrow openings 16 and 18 relative to the initial widths of the openings.

Referring to FIG. 4, an isotropic etch is conducted to extend openings 16 and 18 into base material 12. Liners 22 protect sidewalls of uppermost regions of the openings during such isotropic etching. The isotropic etching forms bowls (or bulbous regions) 24 at lower portions of the openings. Any suitable isotropic etching conditions may be utilized, and the etch may, for example, comprise $NF_3$.

Referring to FIG. 5, the isotropic etching is continued until openings 16 and 18 merge under segment 20, and thus completely undercut such segment. In subsequent processing, masking material 14 may be removed, and the openings 16 and 18 may be filled with material having desired electrical properties to form a desired construction. For instance, the openings 16 and 18 may be filled with electrically insulative material (such as, for example, silicon dioxide) to form an SOI construction having the semiconductor of segment 20 over the insulator of the fill material. As another example, semiconductor material of segment 20 may be doped to form a channel between a pair of source/drain regions, and openings 16 and 18 may be filled with transistor gate material.

Referring to FIGS. 6 and 7, such illustrate a semiconductor construction 50 at a preliminary processing stage of an embodiment for forming SOI structures.

Construction 50 comprises a semiconductor base 12 which may, for example, correspond to the monocrystalline silicon wafer discussed above with reference to the embodiment of FIGS. 1-5. Construction 50 also comprises masking material 14.

A plurality of active area locations 52, 54, 56, 58, 60, 62, 64, 66, 68, 70, 72, 74, 76, 78, 80 and 82 are defined within semiconductor material of base 12, and such locations are approximately demarcated with dashed lines. The active area locations form an array comprising columns extending substantially vertically relative to the shown array (with an example column extending along the active area locations 54, 62, 70 and 78), and comprising rows extending substantially horizontally relative to the shown array (with an example row extending along the active area locations 60, 62, 64 and 66, and accordingly along the cross-section of FIG. 9). Adjacent active area locations of the rows and columns are spaced from one another by regions of semiconductor material of substrate 12, as shown.

Referring to FIGS. 8 and 9, material 14 is patterned to define locations for trenches. Such patterning can be accomplished using a photolithographically patterned photoresist mask (not shown) which may be subsequently removed. The pattern of material 14 is transferred to underlying base 12 to form trenches 90, 92, 94, 96 and 98 between columns of the array of active area locations. Such trenches extend to ends of the active area locations (or in other words, join to the ends of the active area locations).

Referring to FIGS. 10 and 11, trenches 90, 92, 94, 96 and 98 are filled with dielectric material (or in other words, electrically insulative material) 100. The dielectric material may comprise any suitable composition or combination of compositions, and in some embodiments may comprise, consist essentially of, or consist of silicon dioxide. Dielectric material 100 may be formed within the trenches by: initially providing the dielectric material within the trenches and entirely across an upper surface of material 14; and subsequently subjecting construction 50 to planarization (such as, for example, chemical-mechanical polishing) to remove the dielectric material from over uppermost surfaces of masking material 14 while leaving the dielectric material within the trenches.

The filled trenches may be considered to correspond to lines of electrically insulative material 100 extending across substrate 12. The combination of such lines with the rows of active area locations defines a lattice across substrate 12. Sections of substrate 12 which do not contain an active area location may be considered to be at locations between the rows and lines of the lattice, with example sections 102, 104, 106, 108, 110, 112, 114, 116, 118, 120, 122, and 124 being labeled in FIG. 10. The sections along a column of the lattice alternate with active area locations along a column of the array of active area locations. For instance, the sections 104, 112 and 120 along a column of the lattice alternate with active area locations 54, 62, 70 and 78 along a column of the active area array.

Figure 14:
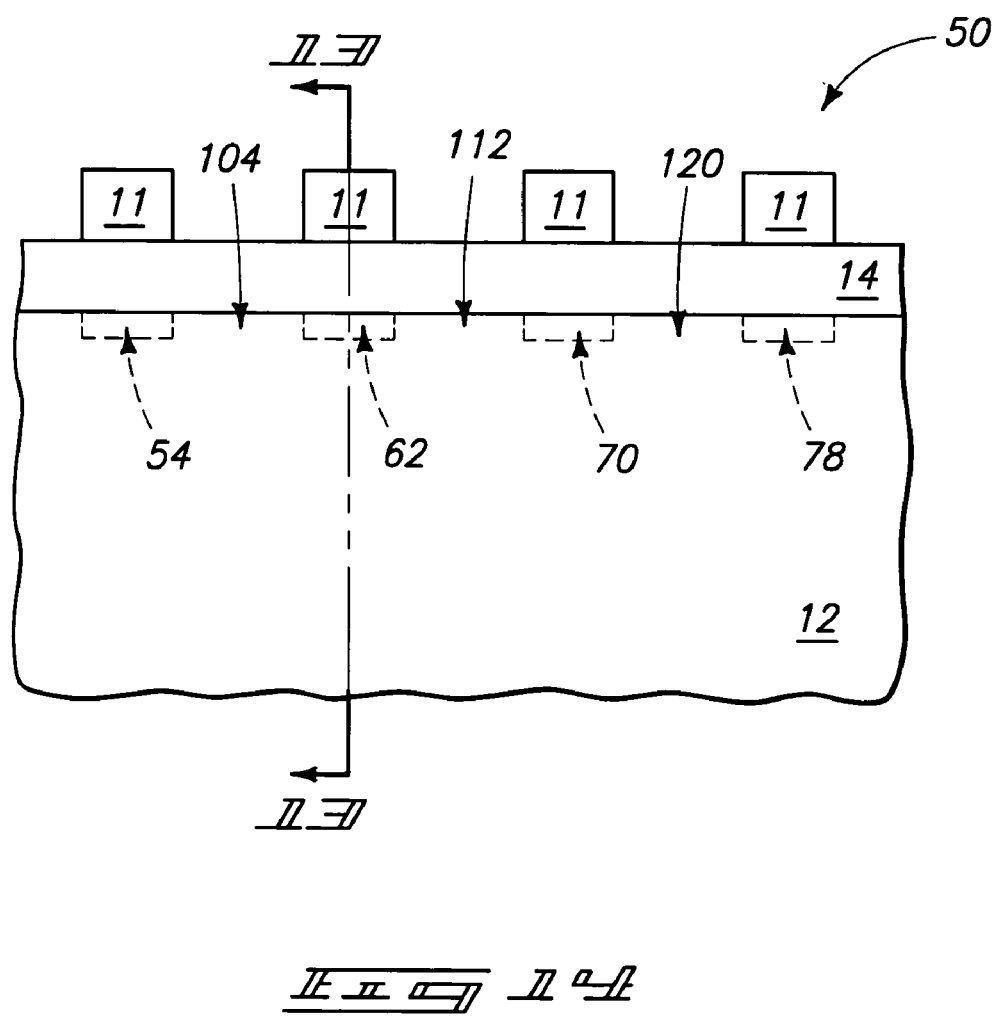

Referring to FIGS. 12-14, a masking material 11 is formed along the rows of the active area locations 52, 54, 56, 58, 60, 62, 64, 66, 68, 70, 72, 74, 76, 78, 80 and 82 (with the active area locations being approximately illustrated in the top view of FIG. 6). The masking materials 11 and 14 together comprise protective material formed over the active area locations to protect such locations from a subsequent etch. Masking material 11 is shown to extend over the dielectric material within trenches 90, 92, 94, 96 and 98.

Masking material 11 may, for example, correspond to a layer of photolithographically patterned photoresist.

The material 14 over sections 102, 104, 106, 108, 110, 112, 114, 116, 118, 120, 122, and 124 remains exposed between the rows of masking material 11.

Referring to FIGS. 15-17, openings 132 are anisotropically etched through material 14 and into sections 102, 104, 106, 108, 110, 112, 114, 116, 118, 120, 122, and 124; masking material 11 is removed; and protective material liners 134 are formed along sidewalls of the openings. The openings within base 12 are analogous to the openings 16 and 18 discussed above with reference to FIG. 3, and the liners are analogous to the liners 22 discussed above with reference to FIG. 3. The openings 132 and liners 134 may thus be formed with processing similar to that discussed above with reference to FIG. 3, and such processing can also remove material 11 as discussed above regarding FIG. 3. The protective material liners 134 narrow openings 132 in a manner analogous to the above-discussed narrowing of openings 16 and 18 by liners 22.

The openings 132 alternate with active area locations along the columns of the active area location array in the same manner that the sections 102, 104, 106, 108, 110, 112, 114, 116, 118, 120, 122, and 124 alternate with such active area locations.

Referring to FIGS. 18-20, openings 132 are extended into base semiconductor material 12 with an isotropic etch similar to that discussed above with reference to FIGS. 4 and 5. Adjacent openings 132 merge beneath active area locations 52, 54, 56, 58, 60, 62, 64, 66, 68, 70, 72, 74, 76, 78, 80 and 82 (with the active area locations being approximately illustrated in the top view of FIG. 6, and also approximately illustrated in the cross-sections of FIGS. 19 and 20) to form extended openings which are entirely around such active area locations. The lines of dielectric material 100 within trenches 90, 92, 94, 96 and 98 anchor the ends of the active area locations at the processing stage of FIGS. 18-20.

Figure 23:
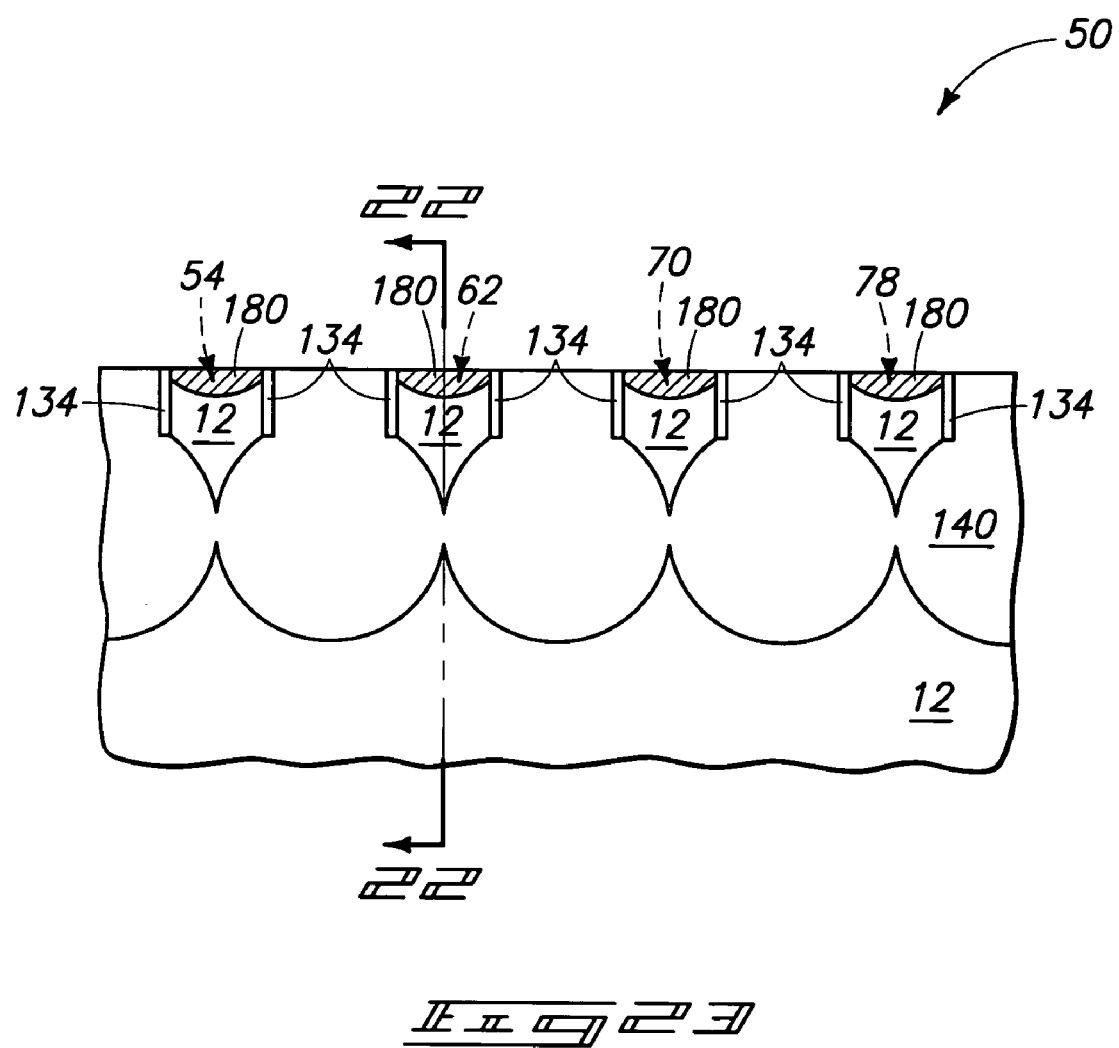
Figure 24:
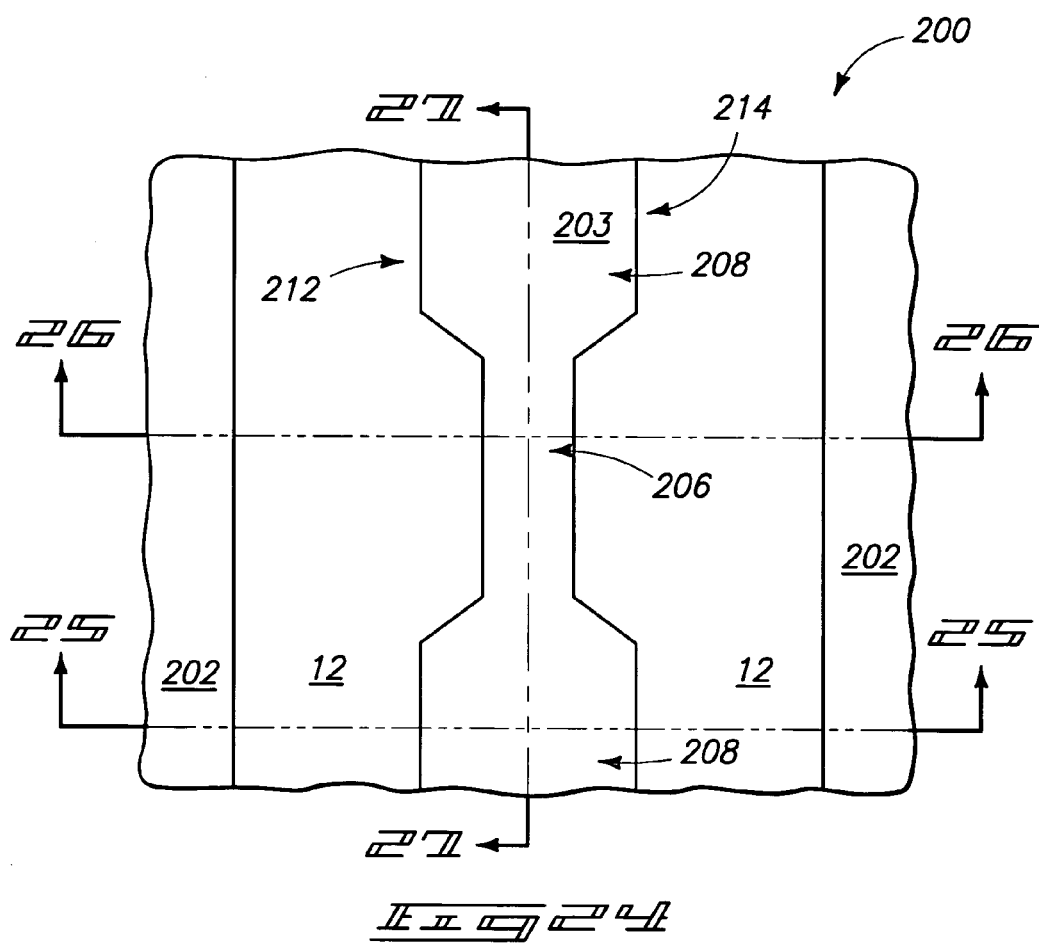
FIGS. 24-27 are a top view and cross-sectional side views of a fragment of a semiconductor construction shown at a preliminary processing stage in accordance with another embodiment. The cross-section of FIG. 25 is along the lines 25-25 of FIGS. 24 and 27; the cross-section of FIG. 26 is along the lines 26-26 of FIGS. 24 and 27; and the cross-section of FIG. 27 is along the lines 27-27 of FIGS. 24-26.
Figure 25:
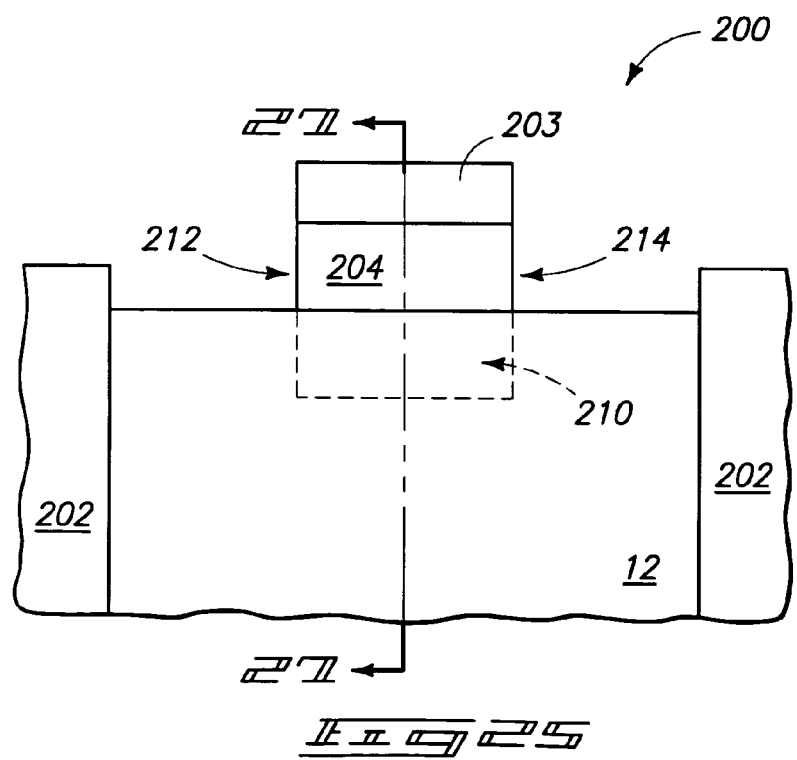
Figure 26:
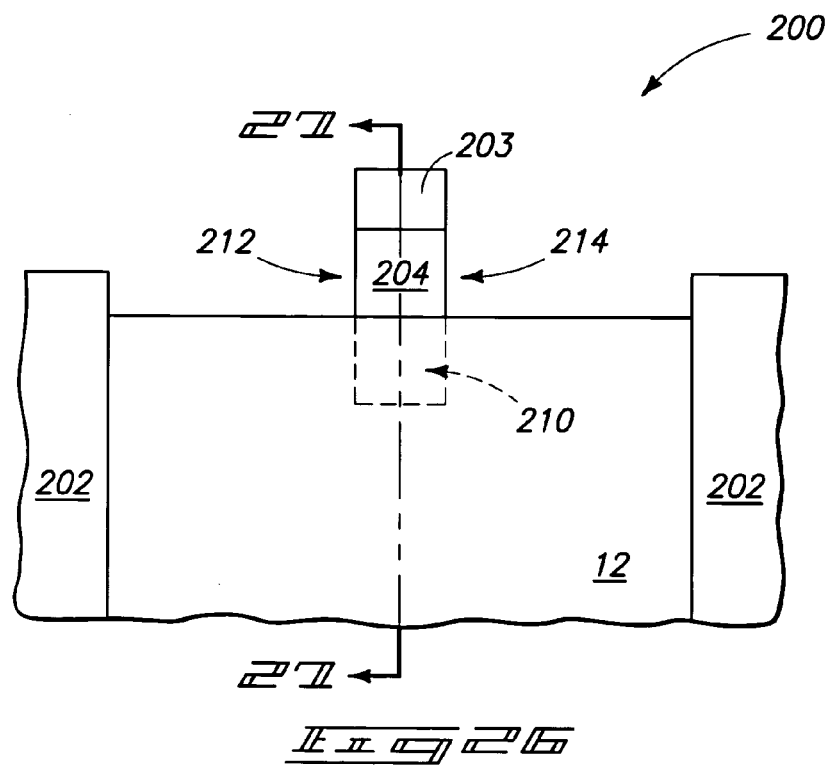
Figure 27:
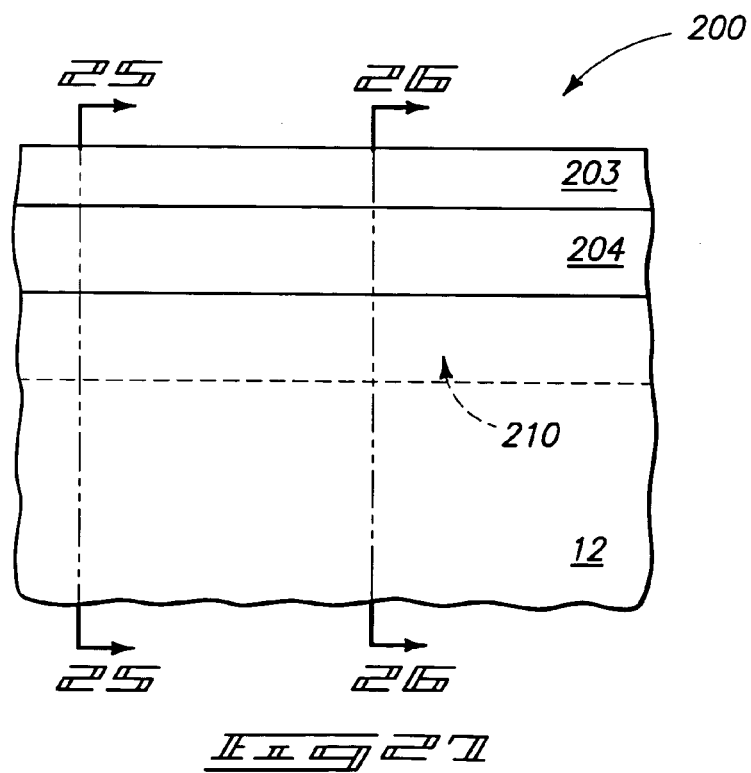
Figure 28:
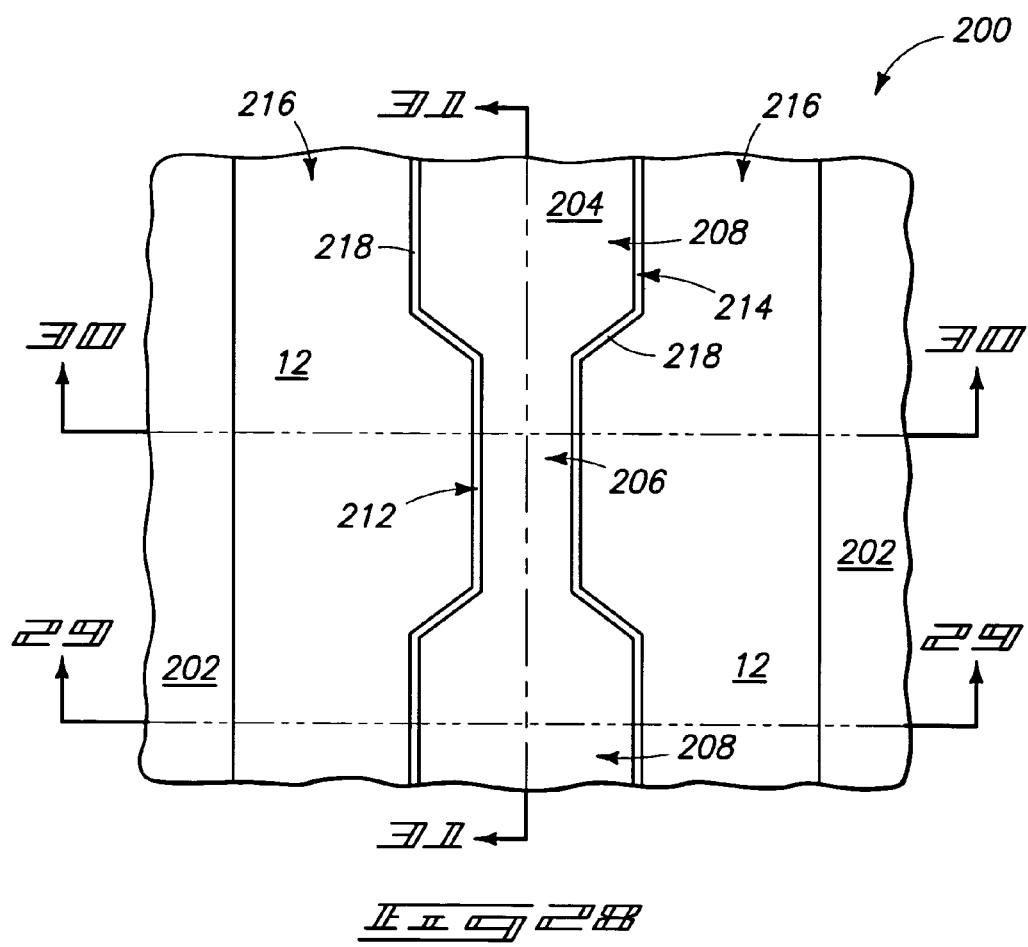
FIGS. 28-31 are views of the fragments of FIGS. 24-27, respectively, shown at a processing stage subsequent to that of FIGS. 24-27. The cross-section of FIG. 29 is along the lines 29-29 of FIGS. 28 and 31; the cross-section of FIG. 30 is along the lines 30-30 of FIGS. 28 and 31; and the cross-section of FIG. 31 is along the lines 31-31 of FIGS. 28-30.
Figure 29:
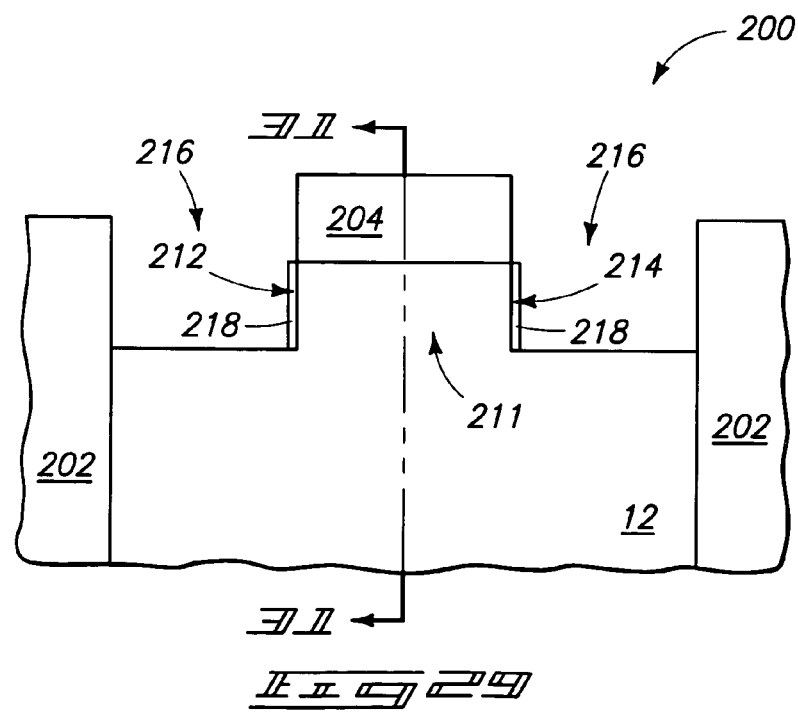
Figure 30:
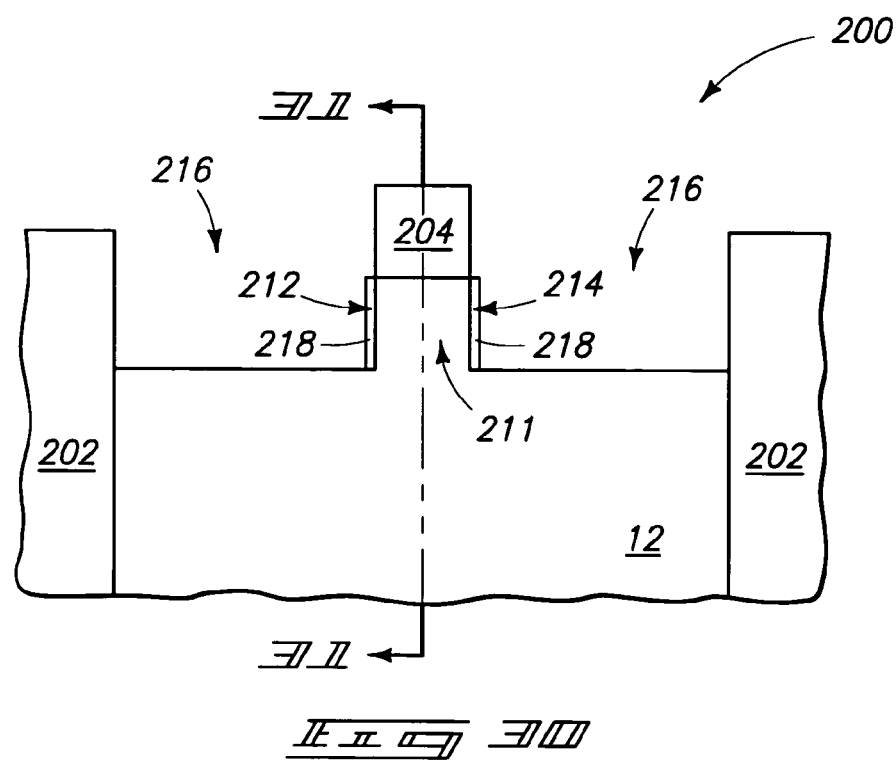
Figure 31:
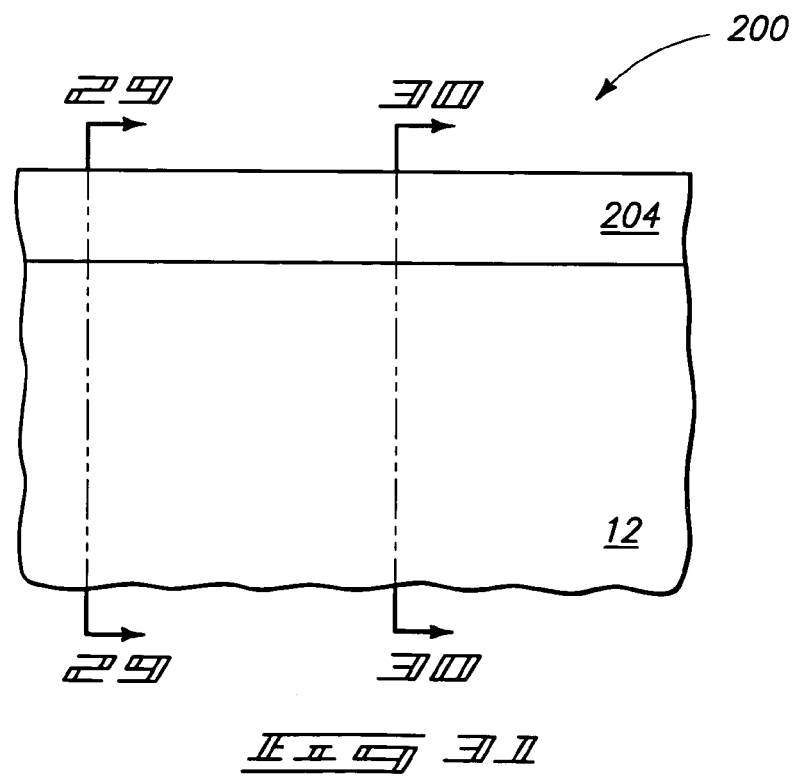
Figure 32:
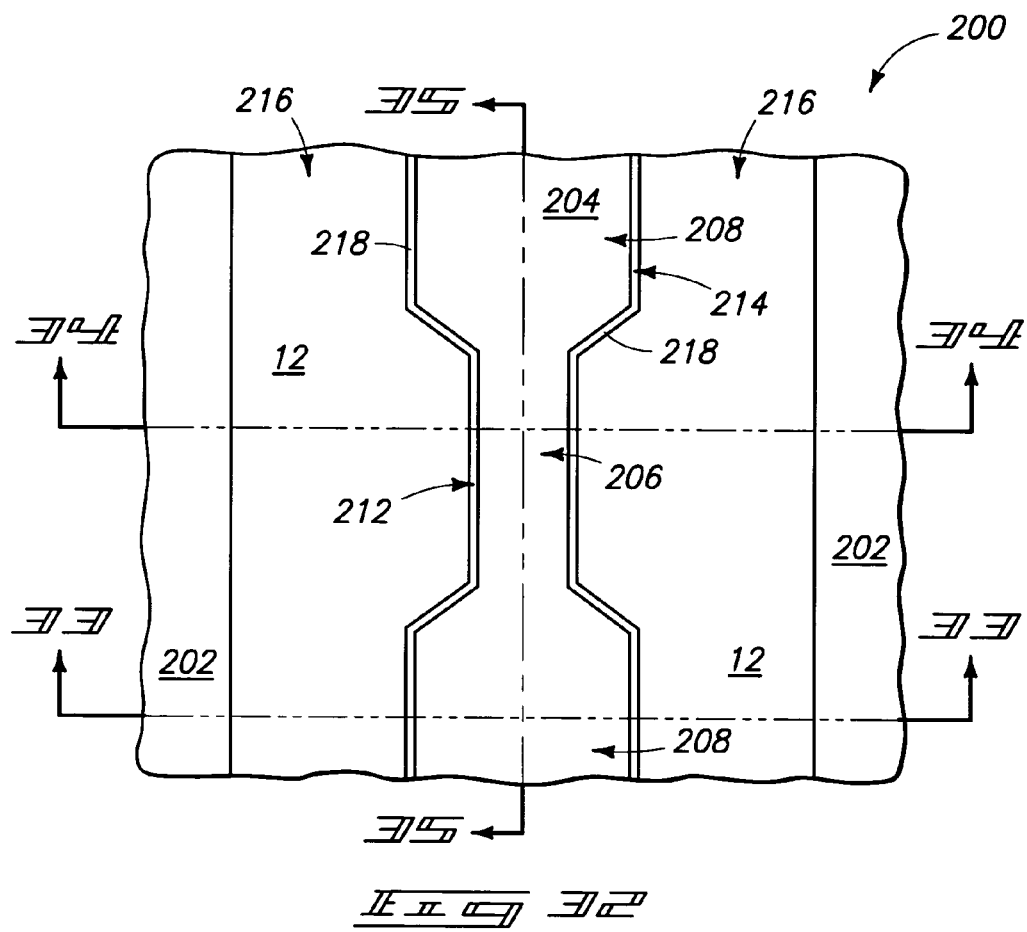
FIGS. 32-35 are views of the fragments of FIGS. 24-27, respectively, shown at a processing stage subsequent to that of FIGS. 28-31. The cross-section of FIG. 33 is along the lines 33-33 of FIGS. 32 and 35; the cross-section of FIG. 34 is along the lines 34-34 of FIGS. 32 and 35; and the cross-section of FIG. 35 is along the lines 35-35 of FIGS. 32-34.

Referring to FIGS. 21-23, openings 132 are filled with electrically insulative material 140, and material 14 is removed. The material 140 may initially be formed to fill the openings and extend over material 14, and subsequently planarization (for instance, chemical-mechanical polishing) may be used to remove materials 140 and 14 from across some regions of substrate 12. Alternatively, planarization may be used to remove material 140 from over material 14, and then material 14 may be removed with an etch selective for material 14 relative to material 140 (with the term "selective" meaning that the etch removes material 14 at a faster rate than the etch removes material 140). Such alternative processing may leave projections of material 140 (not shown) adjacent the active area locations.

Material 140 may comprise any suitable composition or combination of compositions, but preferably comprises a substance which may be readily flowed within the openings. Material 140 may, for example, comprise, consist essentially of, or consist of spin on dielectric (i.e., dielectric material flowable at particular temperature ranges); and may comprise, consist essentially of, or consist of silicon dioxide.

Dielectric materials 100 and 140 may be referred to as first and second dielectric materials, respectively. Such dielectric materials may comprise the same composition as one another in some embodiments.

In the shown embodiment, dielectric material 140 is within the openings, and not across an upper surface of active area locations 52, 54, 56, 58, 60, 62, 64, 66, 68, 70, 72, 74, 76, 78, 80 and 82.

Dielectric material 140 entirely separates semiconductor material 12 within the active region locations from the remaining semiconductor material 12 of the base, as may be seen in the cross-sections of FIGS. 22 and 23.

Spacers 134 are shown to remain within the openings in combination with dielectric material 140. If spacers 134 and dielectric material 140 comprise the same composition as one another, the spacers and dielectric material may merge to form a single insulative material within the openings. In some applications (not shown) it may be desired to remove the spacers 134 with an appropriate etch prior to provision of material 140.

The construction of FIGS. 21-23 comprises a plurality of active areas at locations 52, 54, 56, 58, 60, 62, 64, 66, 68, 70, 72, 74, 76, 78, 80 and 82; with such active areas being SOI structures. In subsequent processing, semiconductor devices may be formed to be associated with the active areas. For instance, FIGS. 21-23 show a plurality of wordlines 150, 152, 154, 156, 158, 160, 162, and 164 extending across the active areas. The cross-section of FIG. 22 shows that the wordlines comprise stacks containing gate dielectric 166, conductive gate material 168, and an electrically insulative cap 170. Also, sidewall spacers 172 are along sidewalls of the wordlines. A plurality of source/drain regions 180 are provided within the semiconductor material 12 of the active area locations; and the wordlines together with the source/drain regions form a plurality of transistor devices.

FIG. 21 diagrammatically illustrates capacitors 182, 184, 186, 188, 190, 192, 194, and 196 electrically connected to some of the source/drain regions; and also diagrammatically illustrates a bitline 199 electrically connected to others of the source/drain regions. Although capacitors and bitline are shown only along the top row of active area locations to simplify the drawing, it is to be understood that capacitors and bitlines would also connect to source/drain regions associated with the other active area locations. Persons of ordinary skill in the art will recognize that the combination of a charge storage device (such as a capacitor) with a transistor corresponds to a dynamic random access memory (DRAM) unit cell, and accordingly a DRAM array may be formed across the construction of FIGS. 21-23.

Referring next to FIGS. 24-27, such illustrate a semiconductor construction 200 at a preliminary processing stage of an embodiment for forming a field effect transistor.

Construction 200 comprises a base 12 which may be of the same composition discussed above regarding FIG. 1, and accordingly may comprise, consist essentially of, or consist of monocrystalline silicon.

A pair of isolation regions 202 extend into base 12. The isolation regions may comprise any suitable electrically insulative composition or combination of compositions, and in some embodiments may comprise, consist essentially of, or consist of silicon dioxide.

Patterned masking materials 203 and 204 extend across an upper surface of base 12. Such patterned masking materials comprise a narrow region 206 between a pair of wide regions 208. The patterned masking materials may comprise any suitable composition or combination of compositions. For instance, material 204 may comprise one or both of silicon dioxide and silicon nitride (and may thus be analogous to the material 14 discussed with reference to FIG. 1), and material 203 may comprise patterned photoresist (and may thus be analogous to the material 11 discussed with reference to FIG. 1).

The patterned masking materials define a line location 210 thereunder which extends within base 12. Specifically, the portion of base 12 under the masking materials corresponds to such line location. The line location thus also comprises the shape of masking materials 203 and 204 of a narrow region between a pair of wide regions.

The masking materials 203 and 204, and line defined thereunder, may be considered to comprise a pair of opposing sides 212 and 214.

Referring to FIGS. 28-31, trenches 216 are etched into semiconductor material of base 12, sidewall liners 218 are formed, and masking material 203 is removed. The formation of the trenches and liners, and removal of masking material 203, may be accomplished with processing similar to that discussed above with reference to FIGS. 2 and 3.

The trenches 216 may be considered to correspond to a pair of trenches, with one trench of such pair being along side 212 of masking material 204, and the other trench of the pair being along side 214 of the masking material. The formation of the trenches 216 transfers the pattern of patterned masking material 204 into the semiconductor material of base 12, and accordingly forms a line 211 at the line location 210 (FIGS. 24-27). Such line has the opposing sidewalls 212 and 214. The line has wide portions and a narrow portion transferred from the shape of the mask. In some embodiments, the narrow portion may have a width which is at least about 25% less than the widths of the wide portions.

Sidewall liners 218 are electrically insulative, and may be referred to as protective material. The liners 218 may comprise, consist essentially of, or consist of silicon dioxide.

Figure 33:
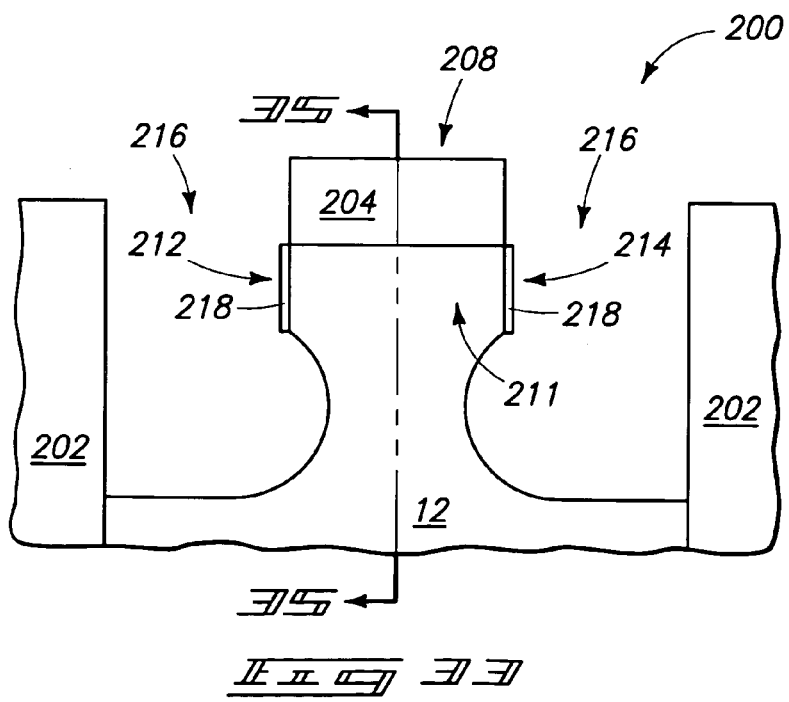
Figure 34:
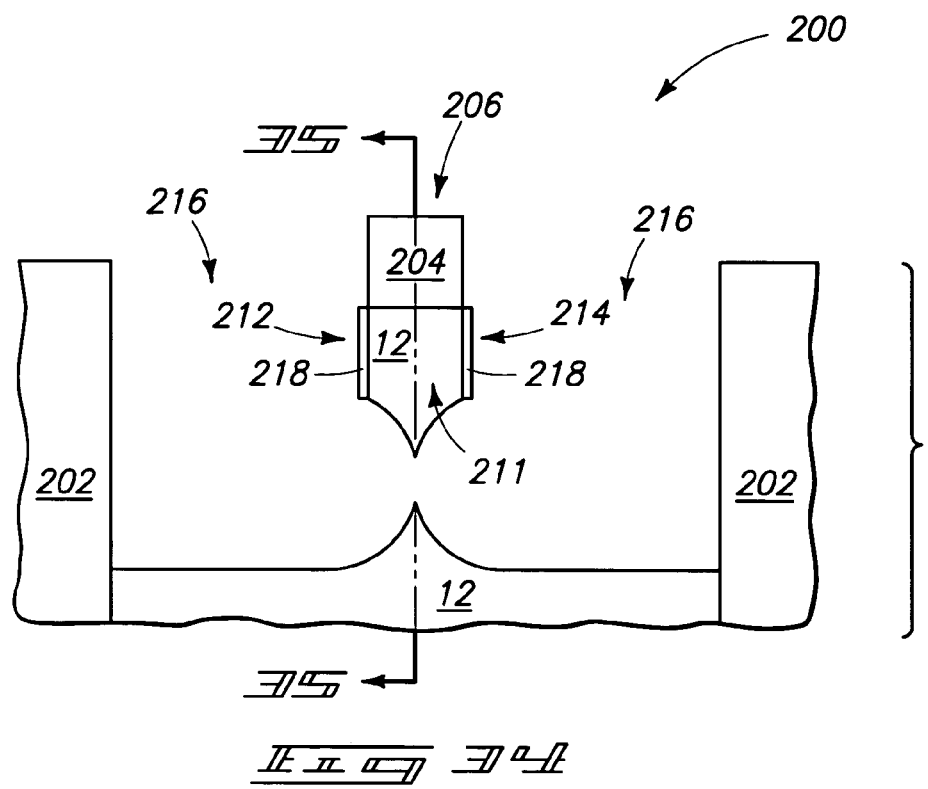
Figure 35:
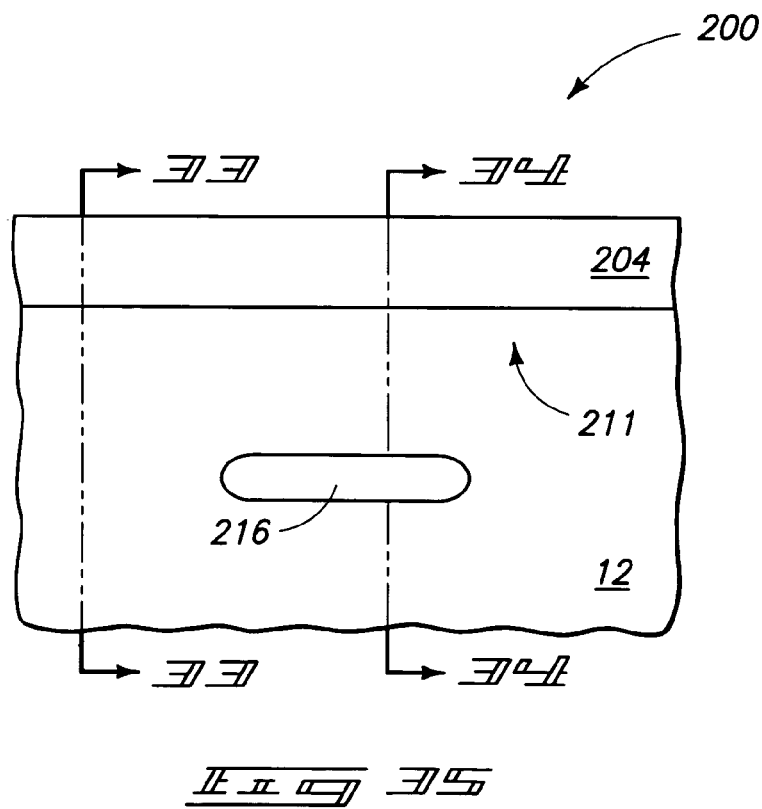
Figure 36:
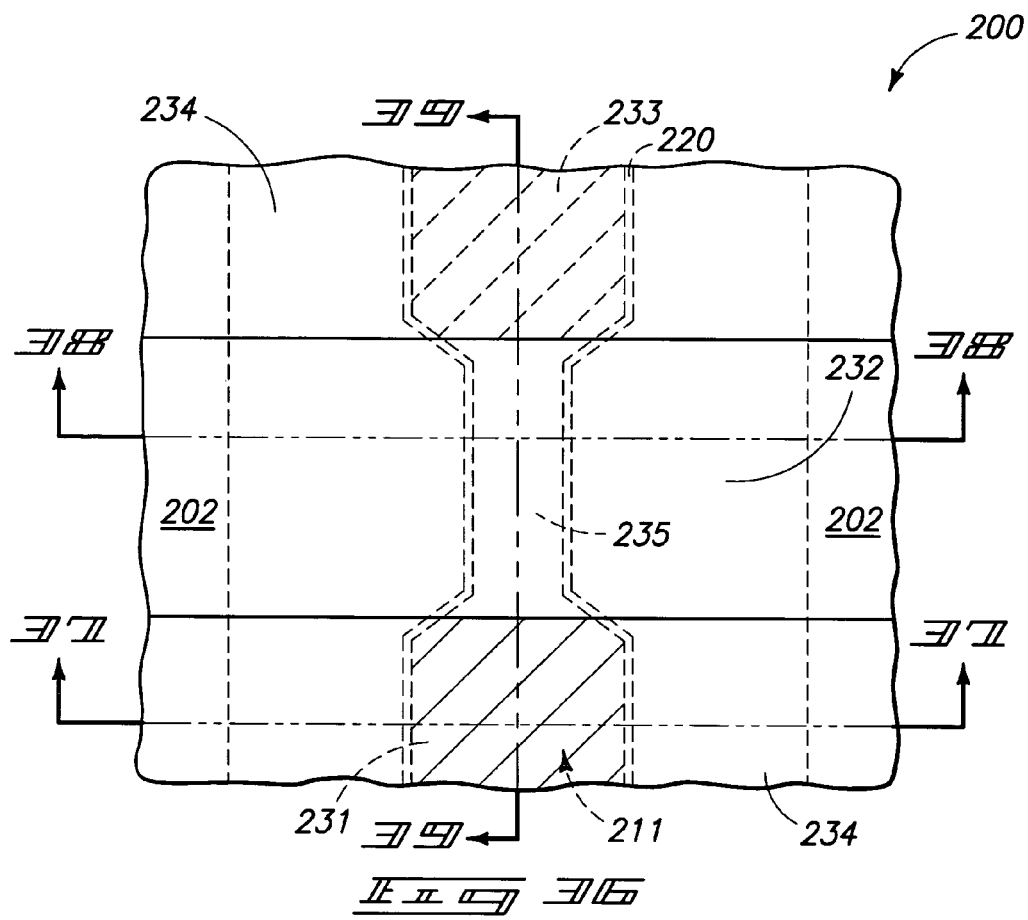
FIGS. 36-39 are views of the fragments of FIGS. 24-27, respectively, shown at a processing stage subsequent to that of FIGS. 32-35. The cross-section of FIG. 37 is along the lines 37-37 of FIGS. 36 and 39; the cross-section of FIG. 38 is along the lines 38-38 of FIGS. 36 and 39; and the cross-section of FIG. 39 is along the lines 39-39 of FIGS. 36-38.
Figure 37:
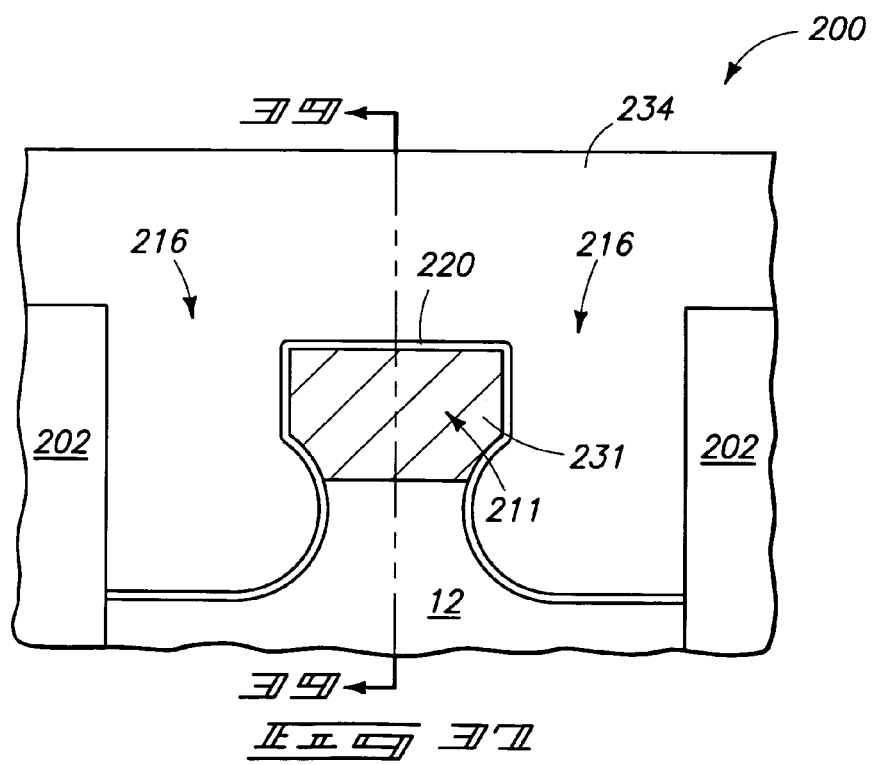

Referring to FIGS. 32-35, openings 216 are extended into base 12 with an isotropic etch analogous to the etch discussed above with reference to FIGS. 4 and 5. The openings from the opposing sides 212 and 214 of line 211 merge under narrow portion 206 of the line (as shown in FIG. 34), but do not merge under the wide portions 208 of the line (as shown in FIG. 33). Thus, the narrow portion 206 of the line is thin enough to enable the openings 216 on the opposing sides of the line to merge during the isotropic etching, while the wide portions 208 of the line are sufficiently wide so that the openings do not merge under such portions. The wide portions 208 thus remain anchored to the bulk of base material 12 after the etching under narrow portion 206, and thus the line segment corresponding to narrow portion 206 is retained to the rest of construction 200.

Referring to FIGS. 36-39, masking material 204 (FIGS. 32-35) is removed, and dielectric material 220 is formed along exposed portions of semiconductor material of base 12. Protective material 218 (FIGS. 32-35) is shown to be removed prior to formation of dielectric material 220. The material 220 is ultimately utilized as gate dielectric, and material 218 may not be suitable as gate dielectric. In alternative embodiments, material 218 may remain as dielectric 220 is formed so that the dielectric 220 covers only portions of material 12 that are not covered by material 218.

Dielectric 220 may comprise any suitable composition or combination of compositions; and may, for example comprise, consist essentially of, or consist of silicon dioxide. Dielectric 220 may be formed by thermal oxidation of exposed surfaces of semiconductor material 12, and/or may be formed by deposition.

The wide portions of line 211 are shown converted to conductive material (as indicated by the cross-hatching) to form transistor source/drain regions 231 and 233. Such conversion may be accomplished by implanting conductivity-enhancing dopant into the material 12 of the line. Although the conversion is shown occurring after removal of the masking material 204 (FIGS. 32-35), it is to be understood that the conversion may also occur prior to the removal of such masking material. Alternatively, the conversion may occur at a processing step subsequent to that of FIGS. 36-39.

The narrow region of line 211 may be appropriately doped with a threshold voltage dopant so that the narrow region corresponds to a transistor channel region 235 between the source/drain regions 231 and 233.

Transistor gate material 232 is formed within the openings 216 and also over the narrow region 206 of line 211; and insulative material 234 is shown formed over the wide portions of line 211 on opposing sides of the gate material. Line 211 is shown in dashed-line view in the top view of FIG. 36 to indicate that it is beneath materials 232 and 234. Other structures of construction 200 are similarly indicated in dashed-line view in the top view of FIG. 36.

Gate material 232 may comprise any suitable composition or combination of compositions, and in some embodiments will comprise, consist essentially of, or consist of one or more of metal, metal-containing compositions and conductively-doped semiconductor material (such as conductively-doped silicon). If the gate material comprises semiconductor material, such material may be referred to as a second semiconductor material to distinguish it from the first semiconductor material of base 12. The gate material may be part of a wordline which extends substantially orthogonally to the line 211.

Insulative material 234 may comprise any suitable composition or combination of compositions; and may, for example, comprise, consist essentially of, or consist of one or both of silicon dioxide and silicon nitride.

Figure 38:
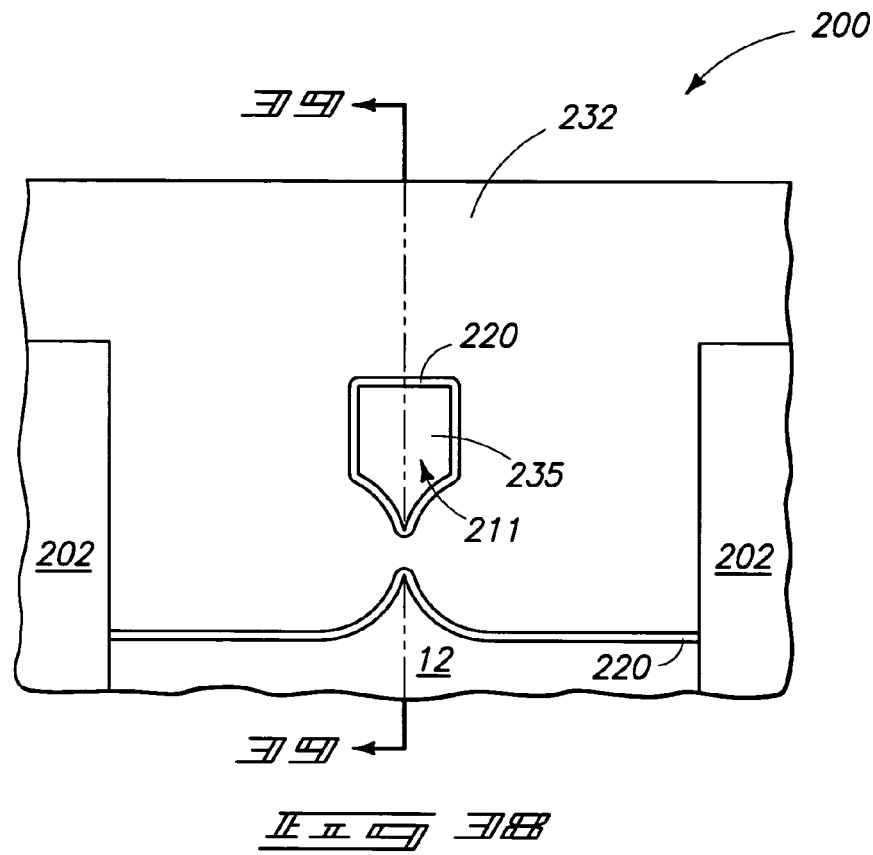
Figure 39:
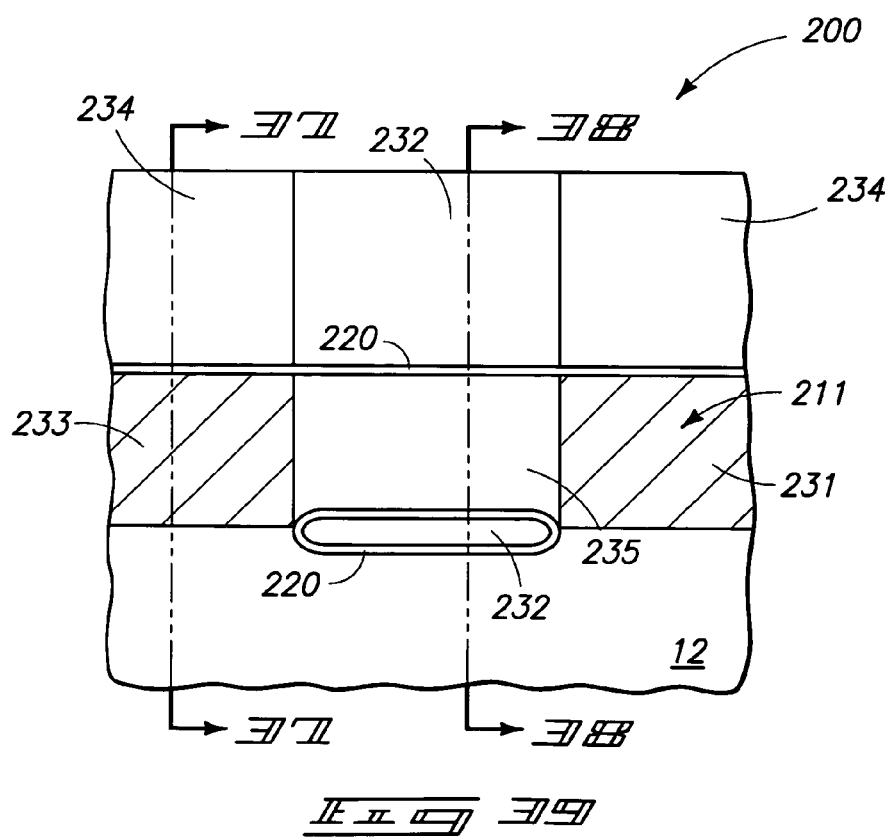

FIG. 38 shows that the gate material 232 entirely surrounds an outer periphery of the narrow portion of line 211, and encircles the channel region 235. The source/drain regions 231 and 233, channel region 235, and gate material 232 together form a field effect transistor. Such field effect transistor has an outer periphery of the channel region fully encircled by gate material in at least one cross-sectional view (for instance, the view of FIG. 38).

Figure 40:
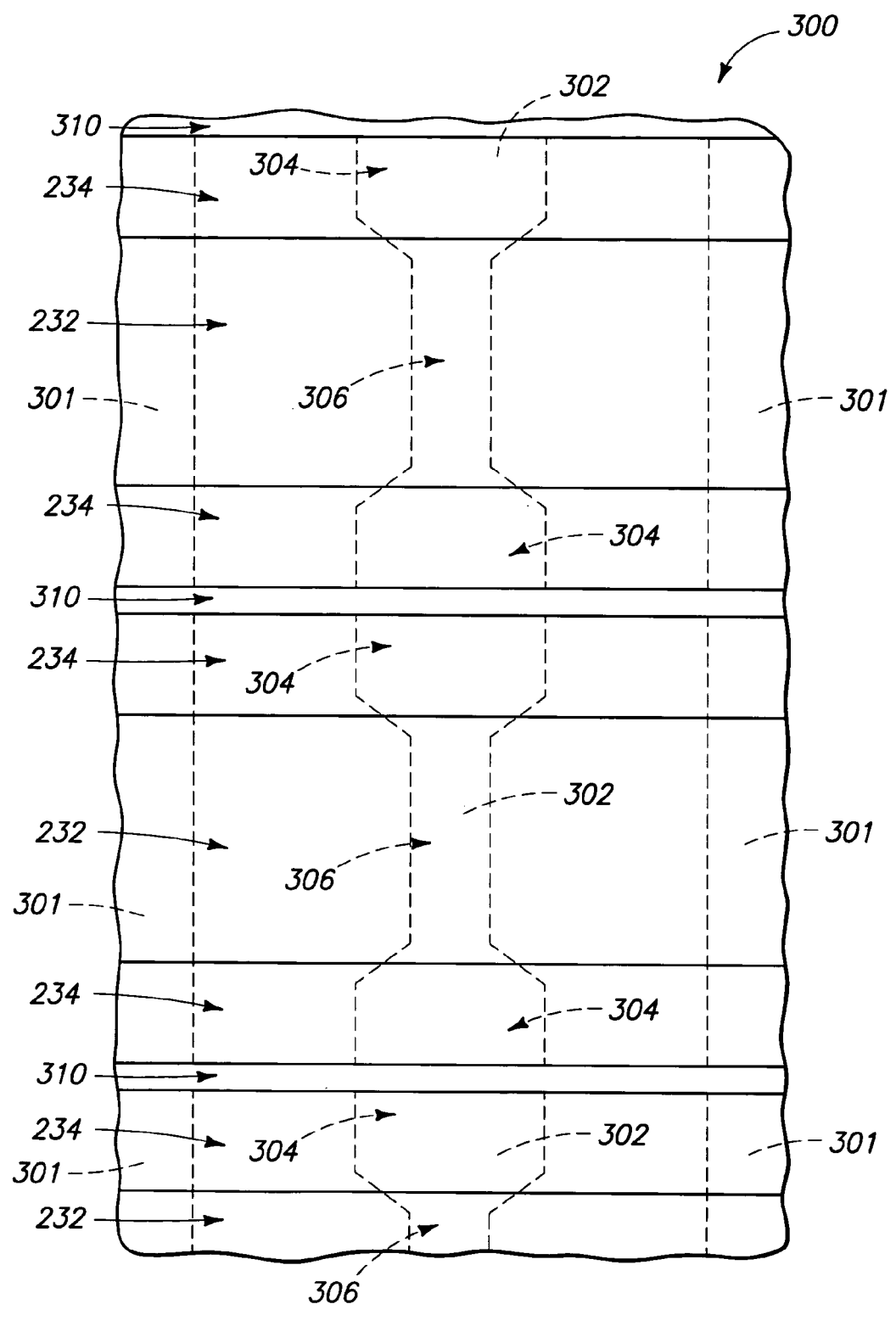
FIG. 40 is a top view of a semiconductor wafer fragment illustrating another embodiment.

FIGS. 36-39 show a single transistor along line 211. It is to be understood, however, that multiple transistors may be formed along the line. FIG. 40 diagrammatically illustrates an example of such embodiment. Specifically, the figure shows a construction 300 comprising a line 302 similar to the line 211 discussed above. The construction also includes isolation regions 301 analogous to the isolation regions 202 of FIGS. 36-39.

Line 302 comprises wide portions 304 and narrow portions 306. Source/drain regions (not shown) may be within the wide portions, and channel regions (not shown) may be within the narrow portions.

The line 302 is shown to be under alternating materials 232 and 234 (with the line 302 being shown in dashed line view to indicate that it is under other materials). Material 232 and 234 are the gate material and electrically insulative material discussed above with reference to FIGS. 36-39. The narrow regions 306 of line 302 are surrounded by gate material 232 analogously to the embodiment shown in FIG. 38.

An insulative material 310 is shown cutting through the wide regions of line 302 to isolate source/drain regions of adjacent transistors from one another. Material 310 may comprise any suitable composition or combination of compositions; and may, for example, comprise, consist essentially of, or consist of silicon dioxide.

Figure 41:
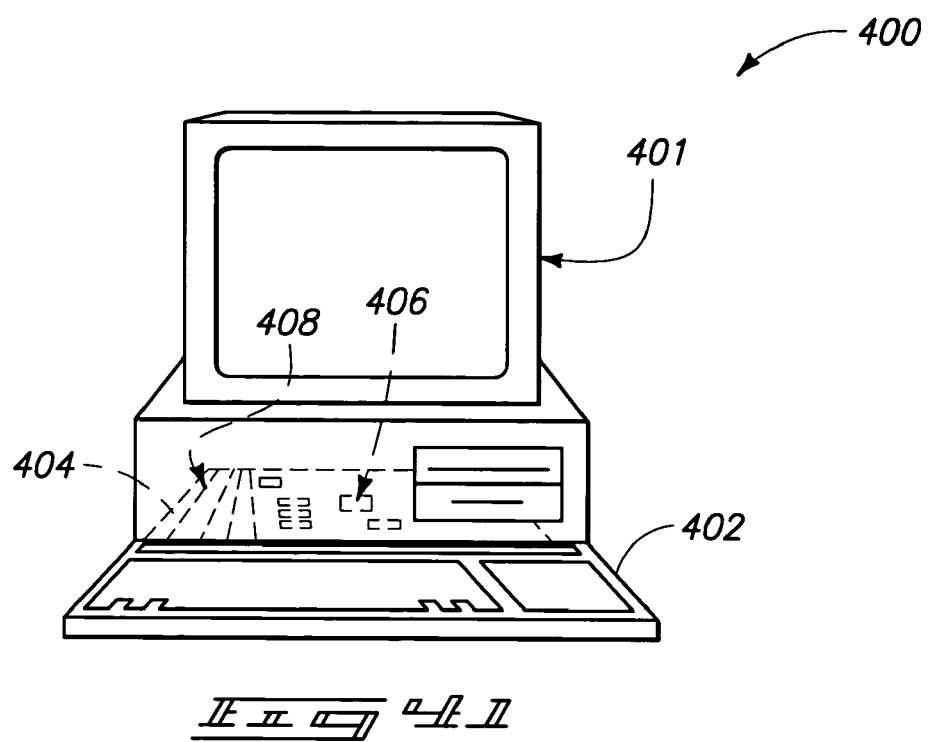
FIG. 41 is a diagrammatic view of a computer embodiment.
Figure 42:
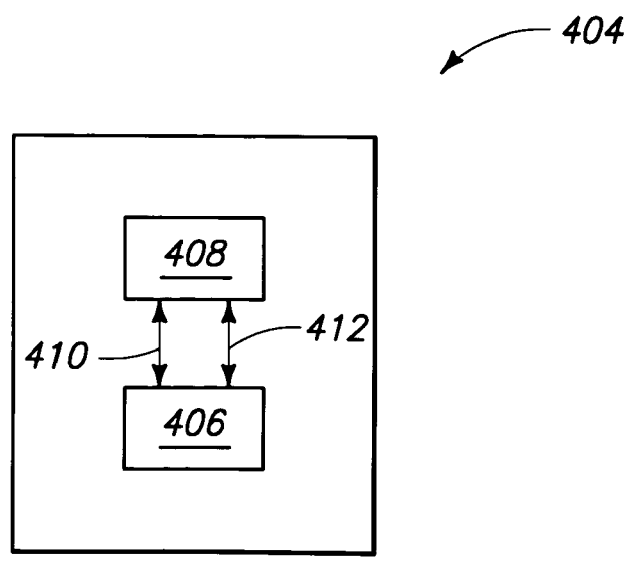
FIG. 42 is a block diagram showing particular features of the motherboard of the FIG. 41 computer embodiment.

FIG. 41 illustrates an embodiment of a computer system 400. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 42. In such block diagram, the addressing circuitry is illustrated as 410 and the read circuitry is illustrated as 412.

Processor device 406 can correspond to a processor module, and contain various of the memory and isolation structures described above.

Memory device 408 can correspond to a memory module, and can comprise various of the memory and isolation structures described above.

Figure 43:
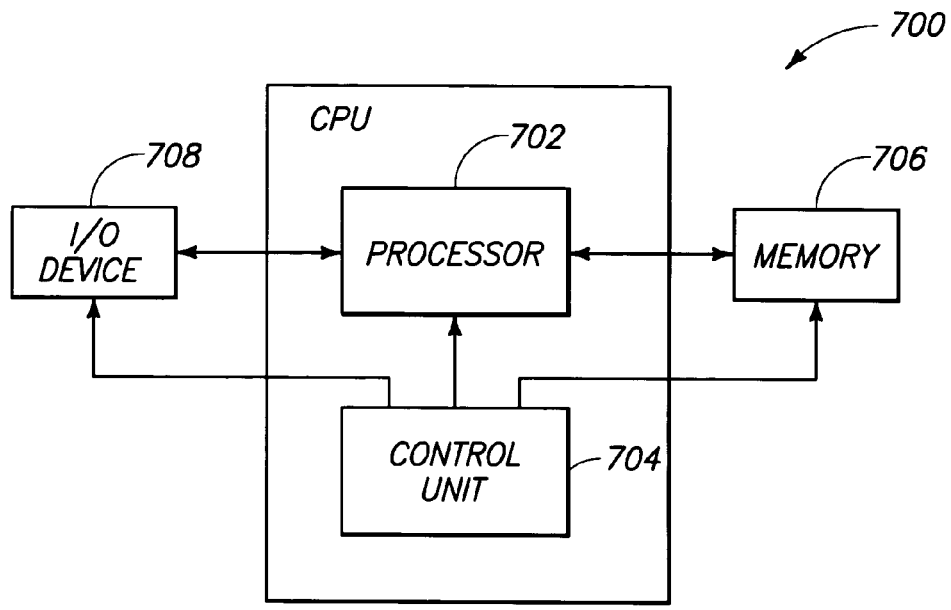
FIG. 43 is a high level block diagram of an electronic system embodiment.

FIG. 43 illustrates a simplified block diagram of a high-level organization of an electronic system 700. System 700 can correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system can have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. Various components of system 700 can include one or more of the memory and isolation structures described above.

Figure 44:
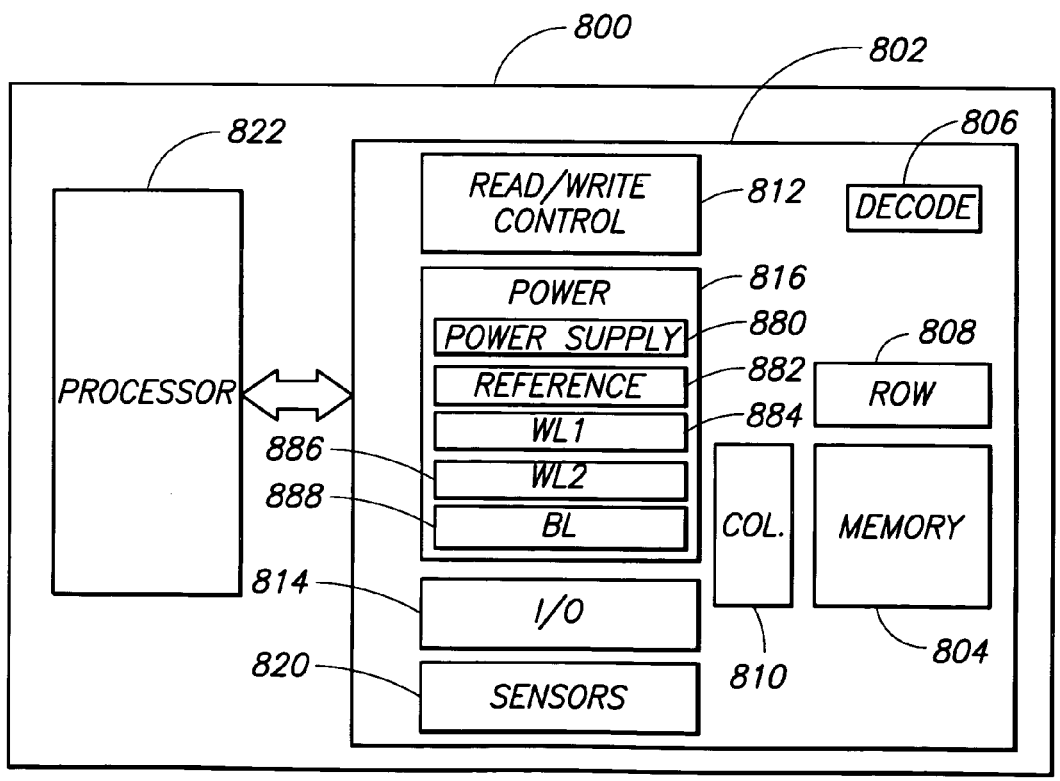
FIG. 44 is a simplified block diagram of a memory device embodiment.

FIG. 44 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 can include various of the memory and isolation structures described above.

The various electronic systems can be fabricated in single-package processing units, or even on a single semiconductor chip, in order to reduce the communication time between the processor and the memory device(s).

The electronic systems can be used in memory modules, device drivers, power modules, communication modems, processor modules, and application-specific modules, and may include multilayer, multichip modules.

The electronic systems can be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a transistor, comprising:
   providing a semiconductor material;
   defining a line across the semiconductor material, the line having a narrow region between wide regions, the line having a pair of opposing sides;
   forming a pair of trenches along opposing sides of the line;
   forming protective material along sidewalls of the trenches to narrow the trenches;
   isotropically etching the semiconductor material through the trenches to merge the trenches under the narrow region without merge the trenches under the wide regions;
   forming gate dielectric along the narrow region of the line;
   forming electrically conductive gate material within the trenches and under the narrow region;
   conductively-doping the wide regions of the line of the semiconductor material to form a pair of source/drain regions; such pair of source/drain regions being spaced from one another by a channel region comprised by the narrow region of the line of the semiconductor material;
   wherein the narrow portion of the line has an outer periphery; and
   wherein the gate material is a transistor gate entirely surrounding the outer periphery of the narrow portion of the line.

2. The method of claim 1 wherein the protective material is removed prior to forming the gate dielectric; and wherein the gate dielectric is formed to entirely surround the narrow region of the line.

3. The method of claim 1 wherein the semiconductor material is monocrystalline silicon, and wherein the gate material comprises at least one composition selected from the group consisting of metal, metal compounds, and conductively-doped semiconductor material.

4. The method of claim 1 wherein the gate material comprises conductively-doped semiconductor material formed by:
   depositing semiconductor material within the merged trenches; and
   in situ doping the semiconductor material as it is deposited within the merged trenches.

5. The method of claim 1 wherein the gate material comprises conductively-doped semiconductor material formed by:
   depositing semiconductor material within the merged trenches; and
   implanting conductive-enhancing dopant into deposited semiconductor material.

* * * * *

UNITED STATES PATENT AND TRADEMARK OFFICE
CERTIFICATE OF CORRECTION

PATENT NO. : 7,537,994 B2
APPLICATION NO. : 11/511596
DATED : May 26, 2009
INVENTOR(S) : Ted Taylor et al.

It is certified that error appears in the above-identified patent and that said Letters Patent is hereby corrected as shown below:

In column 10, line 38, in Claim 1, delete "across" and insert -- of --, therefor.

In column 10, line 46, in Claim 1, delete "merge" and insert -- merging --, therefor.

Signed and Sealed this

Twenty-eighth Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,537,994 B2  Page 1 of 1
APPLICATION NO. : 11/511596
DATED : May 26, 2009
INVENTOR(S) : Taylor et al.

It is certified that error appears in the above-identified patent and that said Letters Patent is hereby corrected as shown below:

Column 10, Line 57 – Replace "portion" with --region--.

Column 10, Line 60 – Replace "portion" with --region--.

Signed and Sealed this

Fifth Day of October, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,537,994 B2 | Page 1 of 1 |
| APPLICATION NO. | : 11/511596 | |
| DATED | : May 26, 2009 | |
| INVENTOR(S) | : Taylor et al. | |

It is certified that error appears in the above-identified patent and that said Letters Patent is hereby corrected as shown below:

Column 10, Line 42, insert --the-- after "along".

Signed and Sealed this
Eighth Day of November, 2011

David J. Kappos
*Director of the United States Patent and Trademark Office*